(12) United States Patent
Oyamatsu

(10) Patent No.: US 7,569,931 B2
(45) Date of Patent: Aug. 4, 2009

(54) COOLING SEMICONDUCTOR DEVICE AND MANUFACTURING METHOD THEREOF

(75) Inventor: Hisato Oyamatsu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 246 days.

(21) Appl. No.: 11/602,494

(22) Filed: Nov. 21, 2006

(65) Prior Publication Data
US 2007/0117306 A1 May 24, 2007

(30) Foreign Application Priority Data
Nov. 21, 2005 (JP) .............................. 2005-336184

(51) Int. Cl.
*H01L 23/34* (2006.01)
(52) U.S. Cl. .............................. 257/713; 257/E31.131; 361/701

(58) Field of Classification Search ................. 257/713, 257/E31.131; 361/701
See application file for complete search history.

(56) References Cited

U.S. PATENT DOCUMENTS

| 5,395,802 | A | * | 3/1995 | Kiyota et al. | .................. 438/52 |
| 5,998,240 | A | | 12/1999 | Hamilton et al. | |
| 6,768,182 | B2 | | 7/2004 | Oyamatsu et al. | |
| 2003/0102510 | A1 | * | 6/2003 | Lim et al. | .................. 257/368 |

* cited by examiner

*Primary Examiner*—Thanh V Pham
(74) *Attorney, Agent, or Firm*—Foley & Lardner LLP

(57) ABSTRACT

A semiconductor device includes a semiconductor substrate, a first diffusion region formed in the semiconductor substrate, a semiconductor element formed in the first diffusion region, and a channel formed in the first diffusion region to receive a cooling fluid.

13 Claims, 21 Drawing Sheets

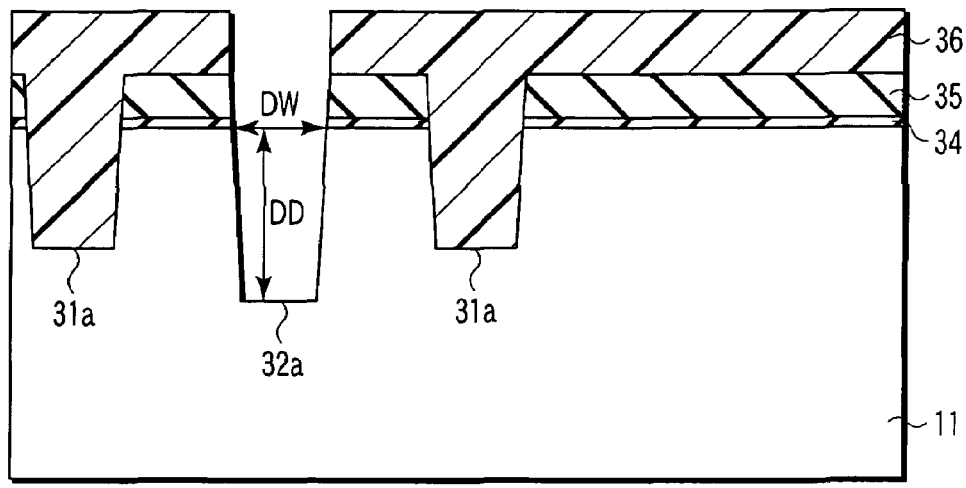
F I G. 13
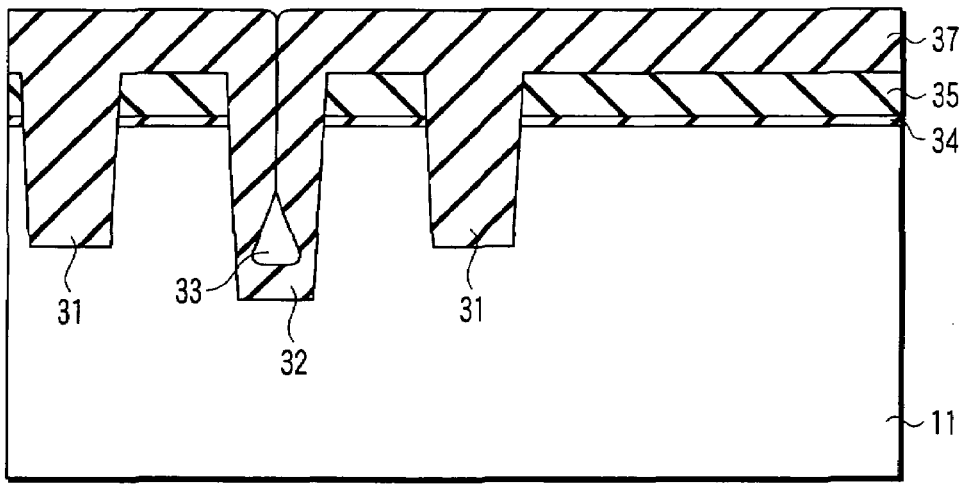
F I G. 14
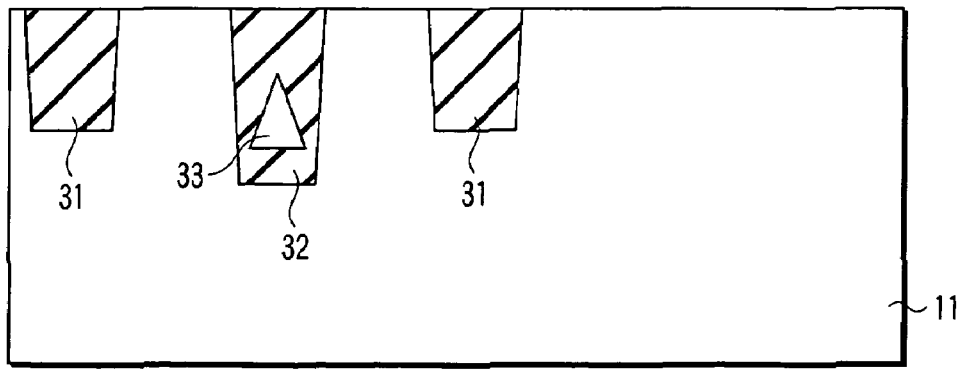
F I G. 15

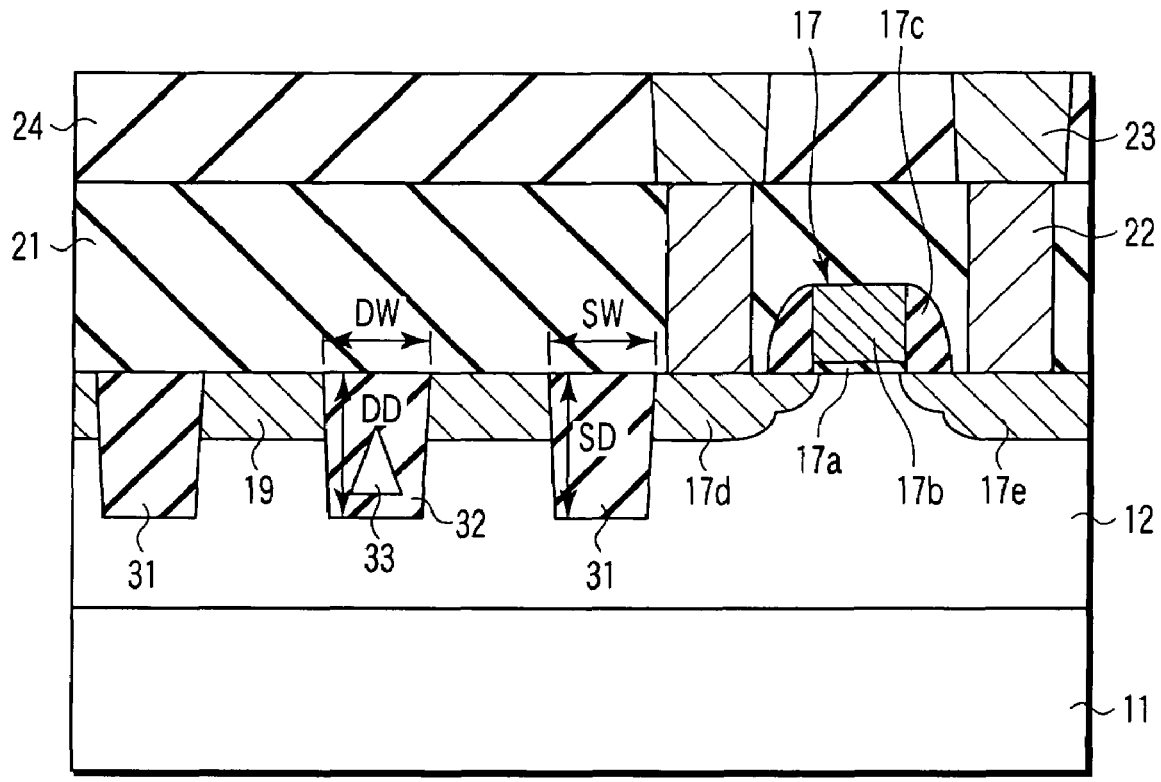
F I G. 21
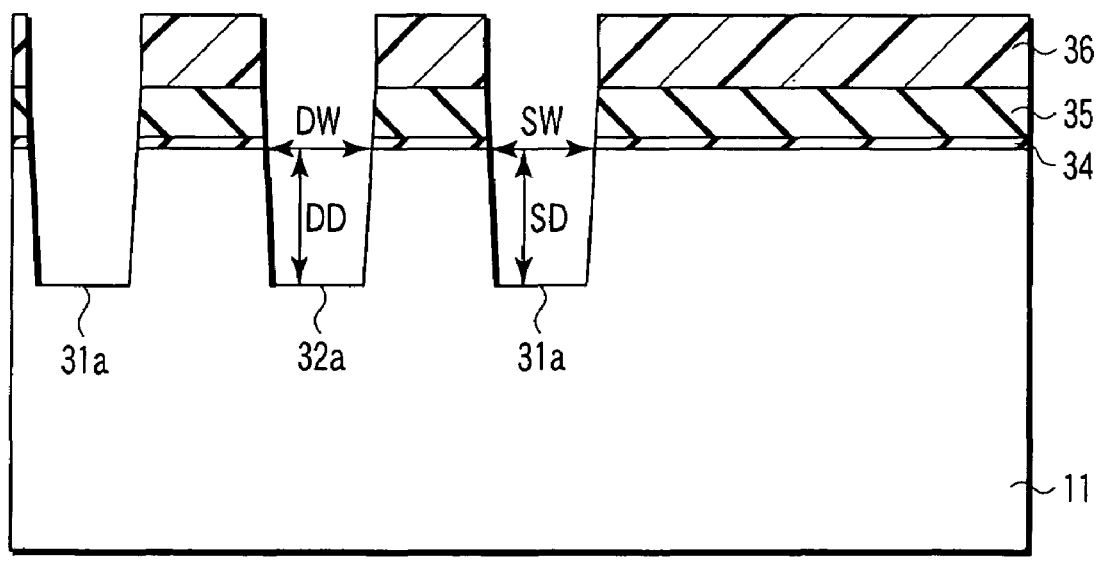
F I G. 22

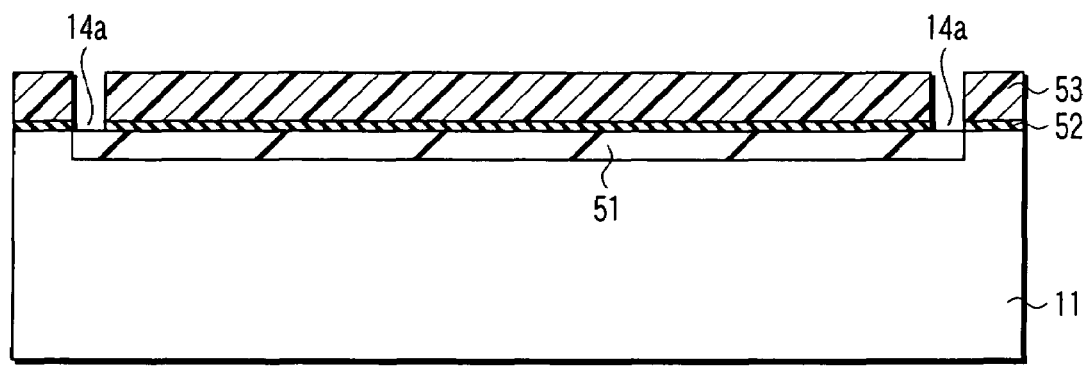
F I G. 30
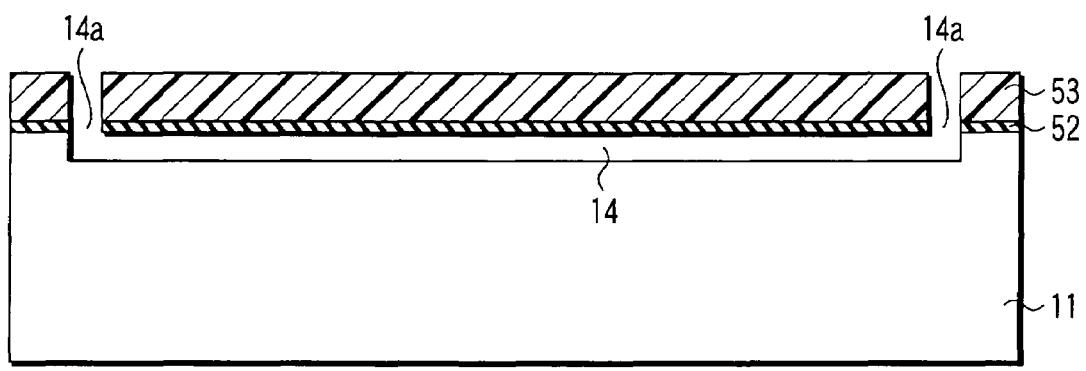
F I G. 31
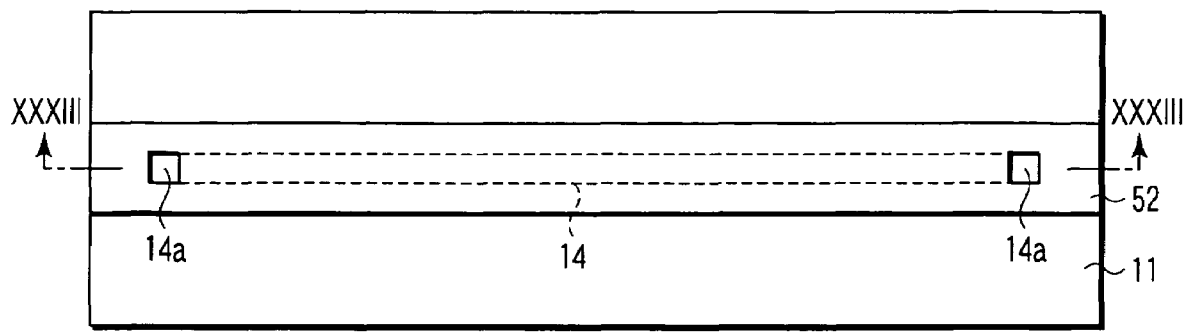
F I G. 32

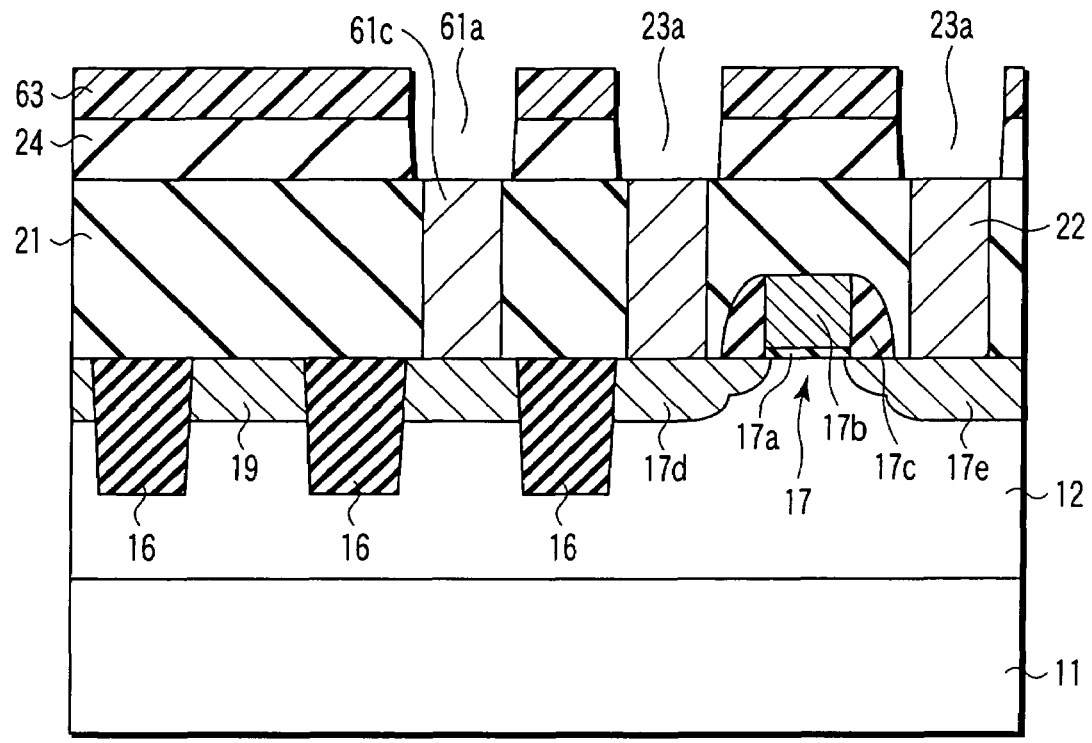
F I G. 39
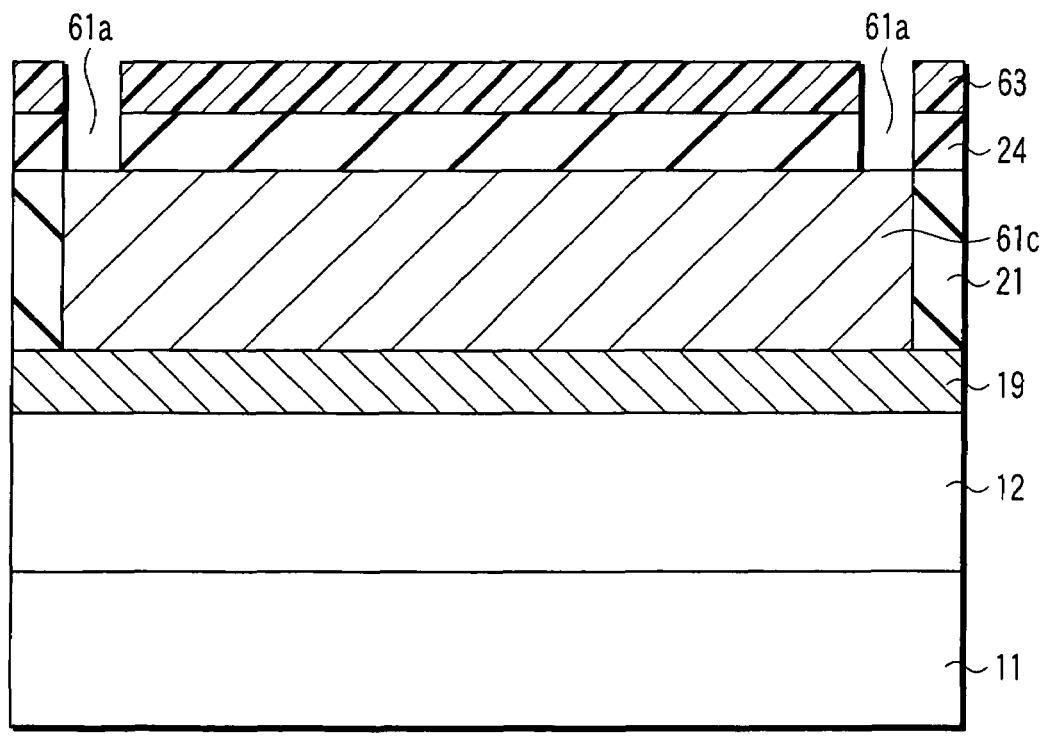
F I G. 40

COOLING SEMICONDUCTOR DEVICE AND MANUFACTURING METHOD THEREOF

CROSS-REFERENCE TO RELATED APPLICATIONS

This application is based upon and claims the benefit of priority from prior Japanese Patent Application No. 2005-336184, filed Nov. 21, 2005, the entire contents of which are incorporated herein by reference.

BACKGROUND OF THE INVENTION

1. Field of the Invention

The present invention relates to a semiconductor device and a manufacturing method thereof and, more particularly, to a coolable semiconductor device and a manufacturing method thereof.

2. Description of the Related Art

Demands have arisen for downsizing and high integration of semiconductor integrated circuits in various fields. To meet these demands, the integration degree and performance of semiconductor integrated circuits have reliably improved as the microfabrication of semiconductor elements and processes advance and the performance of semiconductor elements improves.

On the other hand, the improvements in integration degree and performance of semiconductor integrated circuits largely increase the power consumption of the semiconductor integrated circuits. In addition, the heat generated by this increase in power consumption largely deteriorates the performance of semiconductor elements and the reliability or safety of semiconductor integrated circuits.

The key to the solution of this heat problem of semiconductor integrated circuits is generally the efficiency of radiation of heat from the lower surface of a semiconductor substrate. Therefore, it is being attempted to use low-thermal-resistance materials or improve the structure of a heat pipe or the like for efficient heat radiation.

Unfortunately, the cooling techniques are not well compensating for the increasing power consumption. Accordingly, the temperature of element regions formed in a semiconductor substrate rises, and as a consequence semiconductor elements and therefore a semiconductor integrated circuit malfunction. Also, the heat problem produces a region where the temperature locally rises in a semiconductor integrated circuit. Consequently, this semiconductor integrated circuit can be used only within the range in which the performance is limited, e.g., the voltage is controlled if the temperature rises.

As a technique related to this field, a semiconductor device having a microchannel for supplying a refrigerant to the lower surface opposite to the element formation surface of a substrate is disclosed (U.S. Pat. No. 5,998,240).

BRIEF SUMMARY OF THE INVENTION

According to a first aspect of the present invention, there is provided a semiconductor device comprising: a semiconductor substrate; a first diffusion region formed in the semiconductor substrate; a semiconductor element formed in the first diffusion region; and a channel formed in the first diffusion region to receive a cooling fluid.

According to a second aspect of the present invention, there is provided a semiconductor device comprising: a semiconductor substrate; a first diffusion region formed in the semiconductor substrate; a first semiconductor element formed in the first diffusion region; a channel formed in the first diffusion region to receive a cooling fluid; and an insulating layer which electrically insulates the first diffusion region and the channel, and surrounds the channel.

According to a third aspect of the present invention, there is provided a semiconductor device comprising: a semiconductor substrate; a diffusion region formed in the semiconductor substrate; a semiconductor element formed in the diffusion region; an interlayer dielectric layer formed on the semiconductor substrate; and a channel formed in the interlayer dielectric layer to receive a cooling fluid.

According to a fourth aspect of the present invention, there is provided a method of manufacturing a semiconductor device, comprising: forming, in an upper surface of a semiconductor substrate in which a semiconductor element is to be formed, a plurality of trenches with an equal depth such that said plurality of trenches extend in a first direction; and forming a channel which receives a cooling fluid in the upper surface of the semiconductor substrate by annealing the semiconductor substrate such that the semiconductor substrate viscously fluidifies.

According to a fifth aspect of the present invention, there is provided a method of manufacturing a semiconductor device, comprising: forming, in an upper surface of a semiconductor substrate in which a semiconductor element is to be formed, a first trench and a second trench whose aspect ratio defined by a ratio of a depth to a width is higher than an aspect ratio of the first trench; and burying an insulator in the first trench and the second trench, thereby forming a channel surrounded by the insulator in the second trench to receive a cooling fluid.

According to a sixth aspect of the present invention, there is provided a method of manufacturing a semiconductor device, comprising: forming a semiconductor element in an upper surface of a semiconductor substrate; forming an interlayer dielectric layer on the upper surface of the semiconductor substrate; forming, in the interlayer dielectric layer, a trench as a channel which receives a cooling fluid; forming a first metal layer in the trench to fill the trench; forming an insulating layer on the interlayer dielectric layer and the first metal layer; forming, in the insulating layer, a first hole and a second hole which expose two ends of the first metal layer; and wet-etching the first metal layer.

According to a seventh aspect of the present invention, there is provided a method of manufacturing a semiconductor device, comprising: forming a trench as a channel which receives a cooling fluid, in an upper surface of a semiconductor substrate in which a semiconductor element is to be formed; and forming a semiconductor layer on the semiconductor substrate and above the trench.

According to an eighth aspect of the present invention, there is provided a method of manufacturing a semiconductor device, comprising: forming a trench as a channel which receives a cooling fluid, in an upper surface of a semiconductor substrate in which a semiconductor element is to be formed; forming an insulating layer in the trench to fill the trench; forming a protective layer on the semiconductor substrate and the insulating layer; selectively etching the protective layer to expose two ends of the insulating layer; and wet-etching the insulating layer.

BRIEF DESCRIPTION OF THE SEVERAL VIEWS OF THE DRAWING

FIG. 13 is a sectional view which follows FIG. 12 and illustrates a manufacturing step of the semiconductor device cut in a direction perpendicular to a direction in which a microchannel extends;

FIG. 14 is a sectional view which follows FIG. 13 and illustrates a manufacturing step of the semiconductor device cut in the direction perpendicular to the direction in which the microchannel extends;

FIG. 15 is a sectional view which follows FIG. 14 and illustrates a manufacturing step of the semiconductor device cut in the direction perpendicular to the direction in which the microchannel extends;

FIG. 21 is a sectional view illustrating a semiconductor device according to the fourth embodiment of the present invention;

FIG. 22 is a sectional view illustrating a manufacturing step of the semiconductor device according to the fourth embodiment of the present invention;

FIG. 30 is a sectional view which follows FIG. 29 and illustrates a manufacturing step of the semiconductor device cut in a direction in which a microchannel extends;

FIG. 31 is a sectional view which follows FIG. 30 and illustrates a manufacturing step of the semiconductor device cut in the direction in which the microchannel extends;

FIG. 32 is a plan view which follows FIG. 31 and illustrates a manufacturing step of the semiconductor device;

FIG. 39 is a sectional view which follows FIG. 38 and illustrates a manufacturing step of the semiconductor device cut in the direction perpendicular to the direction in which the microchannel extends;

FIG. 40 is a sectional view which follows FIG. 38 and illustrates a manufacturing step of the semiconductor device cut in the direction in which the microchannel extends;

DETAILED DESCRIPTION OF THE INVENTION

Figure 1:
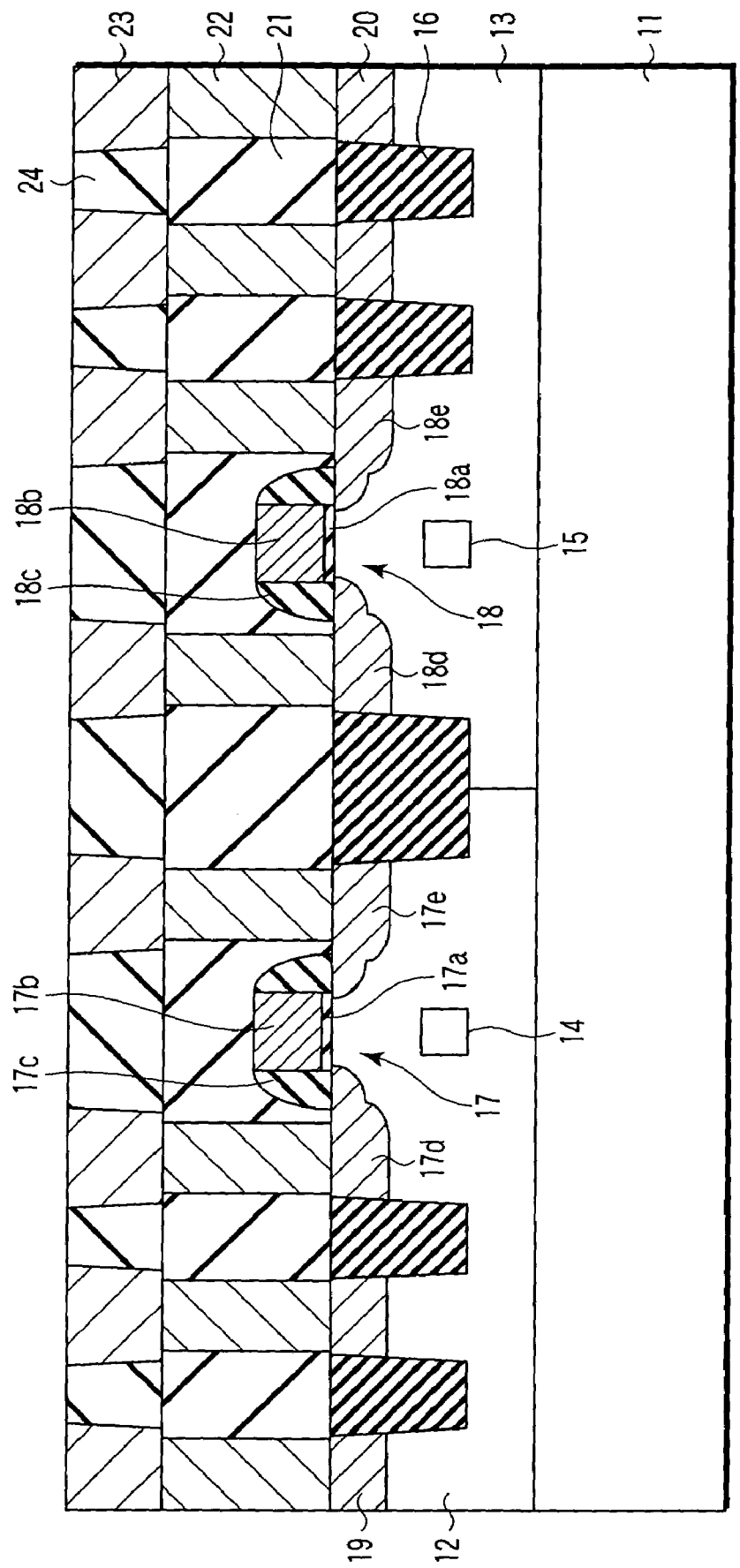
FIG. 1 is a sectional view illustrating a semiconductor device according to the first embodiment of the present invention.

Embodiments of the present invention will be explained below with reference to the accompanying drawing. In the following explanation, the same reference numerals denote elements having the same functions and arrangements, and a repetitive explanation thereof will be made only where necessary.

First Embodiment

FIG. 1 is a sectional view illustrating a semiconductor device according to the first embodiment of the present invention. Note that FIG. 1 is a sectional view cut in a direction perpendicular to a direction in which a microchannel extends.

A p-type diffusion region (p-type well) 12 and n-type diffusion region (n-type well) 13 are formed in the surface region of a p-type semiconductor substrate 11. Examples of the semiconductor substrate 11 are intrinsic semiconductors such as Si and Ge, compound semiconductors such as GaAs and ZnSe, and high-conductivity semiconductors obtained by doping impurities into these semiconductors.

The p-type well 12 is formed by diffusing, e.g., boron (B) as an impurity into the semiconductor substrate 11, and made of a lightly doped impurity region whose the impurity concentration is about $1E-17$ cm$^{-3}$. The n-type well 13 is formed by diffusing, e.g., phosphorus (P) as an impurity into the semiconductor substrate 11, and made of a lightly doped impurity region whose the impurity concentration is about $1E-17$ cm$^{-3}$.

A microchannel 14 as a channel in which a fluid for cooling the semiconductor device flows is formed in the p-type well 12. Also, a microchannel 15 as a fluid channel is formed in the n-type well 13. The width of the microchannels 14 and 15 is, e.g., 0.3 μm. The depth of the microchannels 14 and 15 is, e.g., 0.3 μm.

Figure 2:
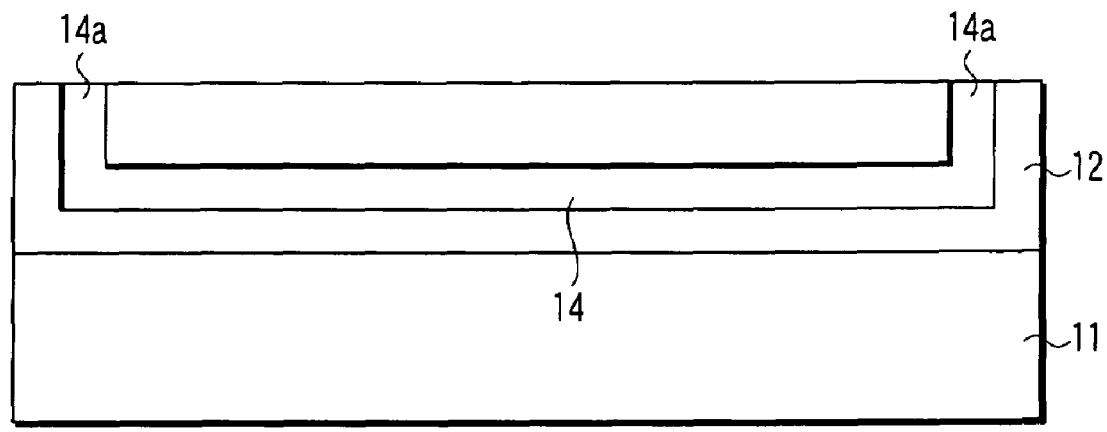
FIG. 2 is a sectional view of the semiconductor device cut in a direction in which a microchannel 14 extends.

FIG. 2 is a sectional view of the semiconductor device cut in a direction in which the microchannel 14 extends. Note that FIG. 2 shows neither semiconductor elements formed in the semiconductor substrate 11 nor interconnection layers and the like formed on the semiconductor substrate 11.

The microchannel 14 extends in a predetermined direction. The length of the microchannel 14 is set larger than that of a semiconductor element formation region of the semiconductor substrate 11.

Holes 14a for supplying a fluid into the microchannel 14 are formed at the two ends of the microchannel 14. For example, the holes 14a extend upward from the two ends of the microchannel 14. The holes 14a may also be formed in the side surfaces of the semiconductor substrate 11. In this case, the microchannel 14 is made of a channel which extends straight in the semiconductor substrate 11. The microchannel 15 has the same arrangement as the microchannel 14.

Element isolation regions 16 are formed in the semiconductor substrate 11 to electrically isolate a plurality of semiconductor elements formed in the semiconductor substrate 11. The element isolation regions 16 are made of, e.g., shallow trench isolations (STIs).

Semiconductor elements and the like are formed in the semiconductor substrate 11. Also, interconnection layers and the like are formed on the semiconductor substrate 11. In this embodiment, a metal oxide semiconductor (MOS) transistor will be explained as an example of the semiconductor element.

An n-type MOS transistor 17 is formed in the p-type well 12. That is, a gate insulating film 17a made of, e.g., SiO$_2$ is formed on the p-type well 12. A gate electrode 17b made of, e.g., polycrystalline silicon is formed on the gate insulating film 17a. Gate sidewall insulating films 17c are formed on the two side surfaces of the gate electrode 17b. A source region 17d and drain region 17e made of n$^+$-type diffusion regions are formed in the p-type well 12 on the two sides of the gate electrode 17b. The source region 17d and drain region 17e have an impurity concentration of about $1E+20$ cm$^{-3}$.

A p-type MOS transistor 18 is formed in the n-type well 13. That is, a gate insulating film 18a made of, e.g., SiO$_2$ is formed on the n-type well 13. A gate electrode 18b made of, e.g., polycrystalline silicon is formed on the gate insulating film 18a. Gate sidewall insulating films 18c are formed on the two side surfaces of the gate electrode 18b. A source region 18d and drain region 18e made of p$^+$-type diffusion regions are formed in the n-type well 13 on the two sides of the gate electrode 18b. The source region 18d and drain region 18e have an impurity concentration of about $1E+20$ cm$^{-3}$.

Also, a p$^+$-type heavily doped impurity region 19 for substrate bias is formed in the p-type well 12. An n$^+$-type heavily doped impurity region 20 for substrate bias is formed in the n-type well 13. The impurity concentration of the heavily doped impurity regions 19 and 20 is the same as, e.g., that of the source region/drain region.

A ground potential Vss is supplied to the p-type semiconductor substrate 11, p-type well 12, and p$^+$-type heavily doped impurity region 19. A power supply potential Vdd is supplied to the n-type well 13 and n$^+$-type heavily doped impurity region 20.

An interlayer dielectric layer 21 made of, e.g., SiO$_2$ is formed on the semiconductor substrate 11. Contact plugs 22 connected to the semiconductor elements formed in the semiconductor substrate 11 are formed in the interlayer dielectric layer 21. The contact plugs 22 are made of, e.g., W. An insulating layer 24 is formed on the interlayer dielectric layer 21. Interconnection layers 23 connected to the contact plugs 22 are formed in the insulating layer 24. The interconnection layers 23 are made of, e.g., Cu. In this manner, the semiconductor device is manufactured.

Figure 3:
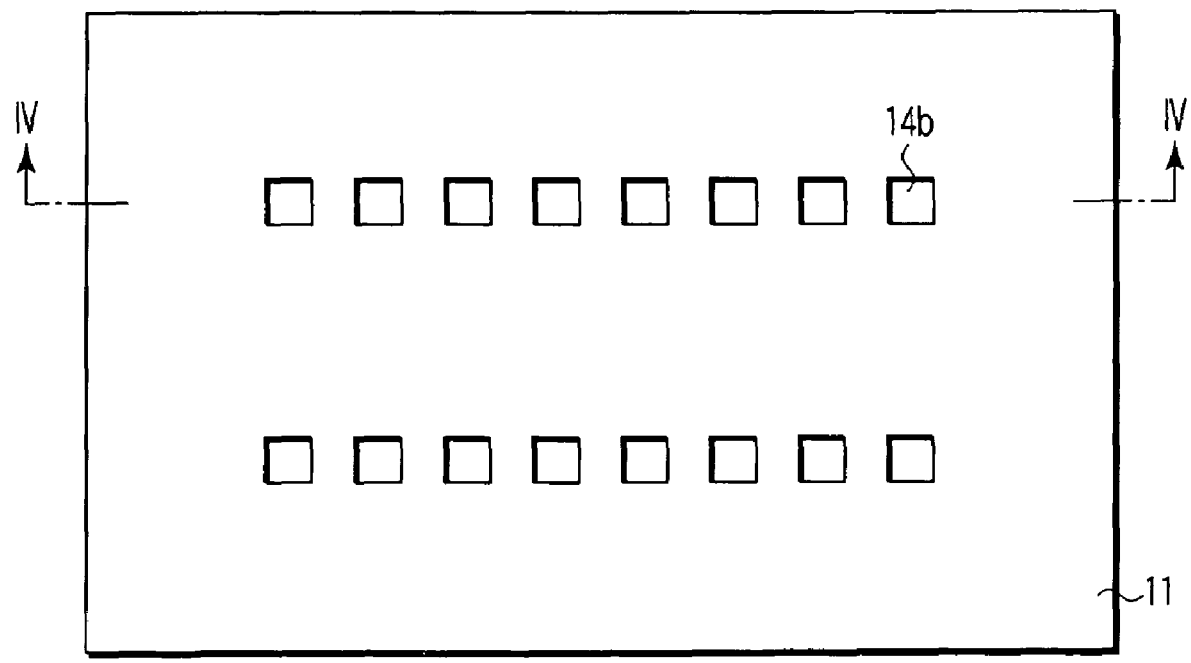
FIG. 3 is a plan view illustrating a manufacturing step of the semiconductor device according to the first embodiment of the present invention.
Figure 4:
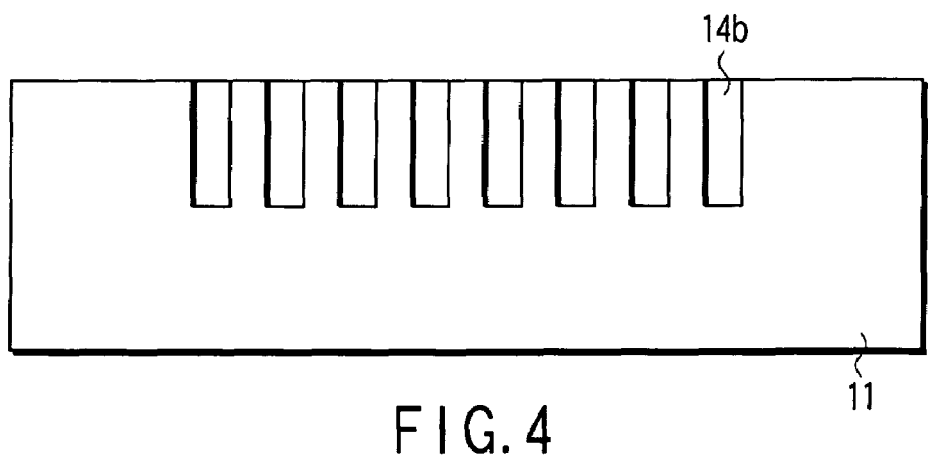
FIG. 4 is a sectional view taken along a line IV-IV shown in FIG. 3.
Figure 5:
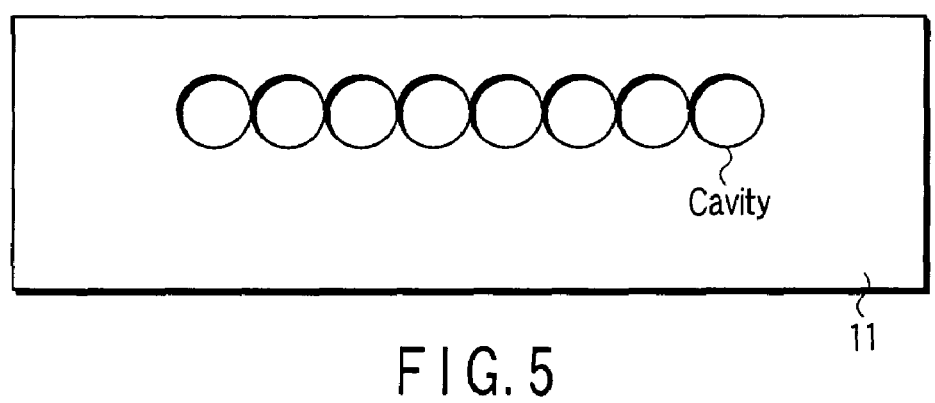
FIG. 5 is a sectional view which follows FIG. 4 and illustrates a manufacturing step of the semiconductor device cut in the direction in which the microchannel extends.
Figure 6:
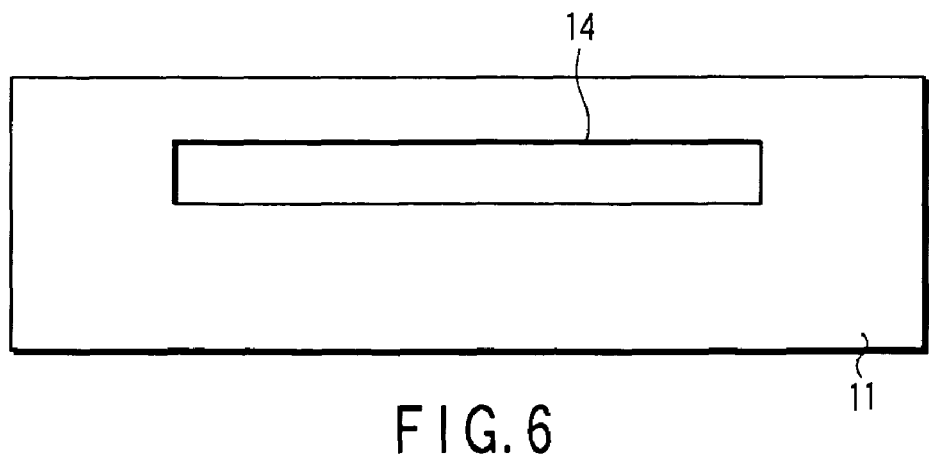
FIG. 6 is a sectional view which follows FIG. 5 and illustrates a manufacturing step of the semiconductor device cut in the direction in which the microchannel extends.
Figure 7:
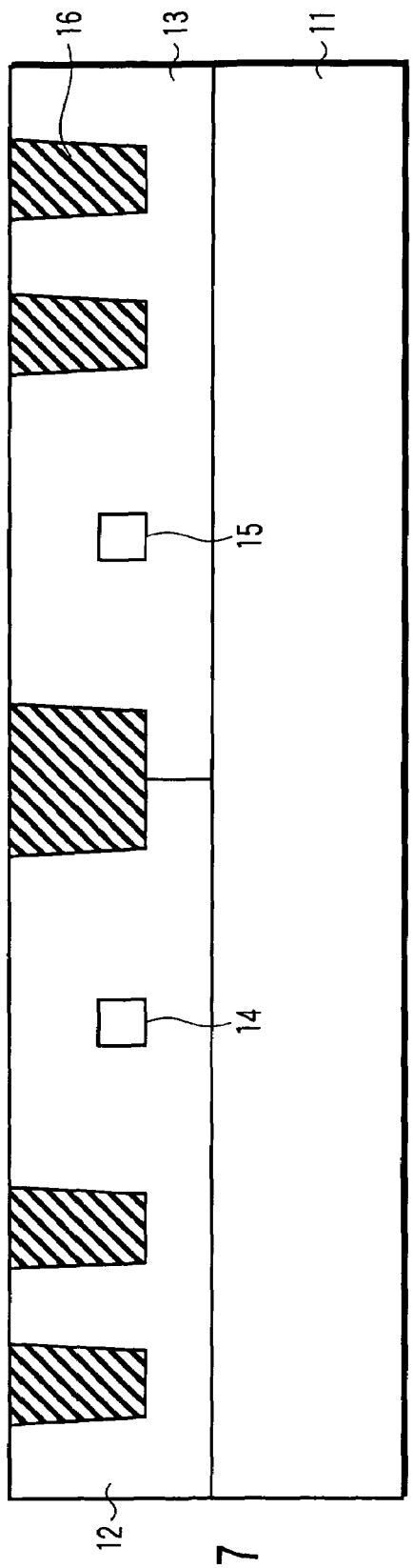
FIG. 7 is a sectional view which follows FIG. 6 and illustrates a manufacturing step of the semiconductor device cut in a direction perpendicular to the direction in which the microchannel extends.
Figure 8:
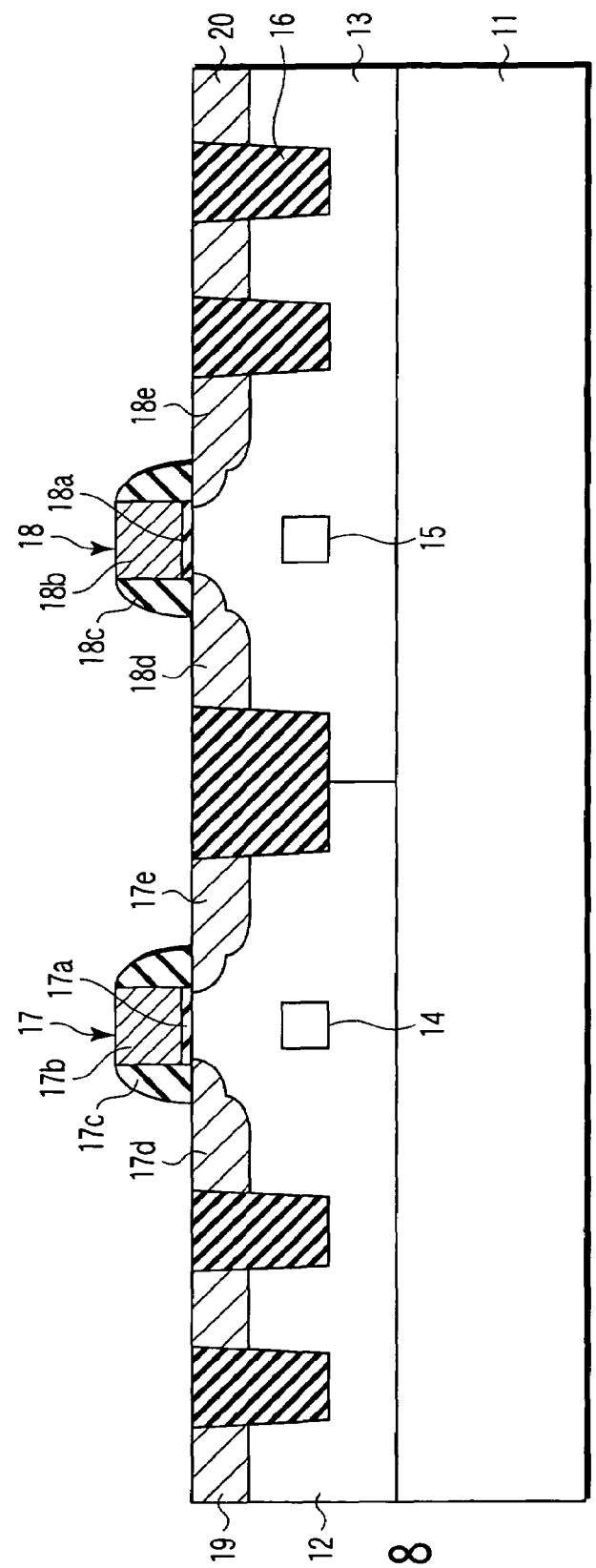
FIG. 8 is a sectional view which follows FIG. 7 and illustrates a manufacturing step of the semiconductor device cut in the direction perpendicular to the direction in which the microchannel extends.

An example of a manufacturing method of the semiconductor device will be explained below. FIG. 3 is a plan view illustrating a manufacturing step of the semiconductor device. FIGS. 4 to 6 are sectional views illustrating manufacturing steps of the semiconductor device cut in the direction in which the microchannel extends. FIGS. 7 and 8 are sectional views illustrating manufacturing steps of the semiconductor device cut in a direction perpendicular to the direction in which the microchannel extends.

First, as shown in FIG. 3 and FIG. 4 (a sectional view taken along a line IV-IV shown in FIG. 3), a plurality of trenches 14b are formed in a semiconductor substrate 11 by using lithography and reactive ion etching (RIE). The width of the trench 14b (i.e., the longitudinal and lateral lengths of the trench 14b in the plan view) is, e.g., 0.3 μm. The interval between adjacent trenches 14b is, e.g., 0.3 μm.

Then, as shown in FIG. 5, the semiconductor substrate 11 is annealed at a high temperature. When the semiconductor substrate 11 is made of Si, the annealing temperature is set equal to or higher than 1,000° C. at which Si viscously fluidifies. Consequently, the openings of the trenches 14b close to form a plurality of cavities, and adjacent cavities connect to each other. Finally, as shown in FIG. 6, all the cavities connect to each other to form one microchannel 14.

As shown in FIG. 2, holes 14a connected to the two ends of the microchannel 14 to supply a fluid are formed using lithography and RIE. Note that a microchannel 15 is formed by the same method as above.

As shown in FIG. 7, a p-type well 12 is formed by doping a low-concentration (about $1E-17$ cm$^{-3}$) p-type impurity into the semiconductor substrate 11. Also, an n-type well 13 is formed by doping a low-concentration (about $1E-17$ cm$^{-3}$) n-type impurity into the semiconductor substrate 11. Note that the p-type well 12 is formed so that the depth of the p-type well 12 is larger than that of the bottom surface of the microchannel 14. Likewise, the n-type well 13 is formed so that the depth of the n-type well 13 is larger than that of the bottom surface of the microchannel 15.

Subsequently, STIs 16 are selectively formed in the semiconductor substrate 11. That is, lithography and RIE are used to form trenches in regions where STIs 16 are to be formed, and an insulator made of, e.g., SiO$_2$ is buried in these trenches. Then, chemical mechanical polishing (CMP) is used to remove the extra insulating layer except for the regions where STIs 16 are to be formed, and planarize the surface of the semiconductor substrate 11.

As shown in FIG. 8, a gate insulating film 17a is formed on the p-type well 12 by using lithography and RIE. Poly-Si is then deposited on the gate insulating film 17a by chemical vapor deposition (CVD). A gate electrode 17b is formed on the gate insulating film 17a by patterning the poly-Si layer by using lithography and RIE.

A low-concentration n-type impurity is doped into the p-type well 12 by using the gate electrode 17b as a mask, thereby forming extension regions in the p-type well 12 on the two sides of the gate electrode 17b. Gate sidewall insulating films 17c are formed on the two side surfaces of the gate electrode 17b. A high-concentration (about $1E+20$ cm$^{-3}$) n$^+$-type impurity is doped into the p-type well 12 by using the gate sidewall insulating films 17c as masks, thereby forming a source region 17d and drain region 17e in the p-type well 12 on the two sides of the gate sidewall insulating films 12c. In this way, an n-type MOS transistor 17 is formed.

Also, as shown in FIG. 8, a high-concentration (about $1E+20$ cm$^{-3}$) p$^+$-type impurity is doped into the p-type well 12 to form a heavily doped impurity region 19 for substrate bias. Note that manufacturing steps of a p-type MOS transistor 18 and heavily doped impurity region 20 are the same as those of the n-type MOS transistor 17 and heavily doped impurity region 19 except for the conductivity type.

Then, as shown in FIG. 1, an interlayer dielectric layer 21 is deposited on the semiconductor substrate 11 by CVD. Trenches for exposing the source and drain regions of the MOS transistors and the heavily doped impurity regions are formed in the interlayer dielectric layer 21 by lithography and RIE. Contact plugs 22 are formed by burying a metal such as W in these trenches.

An insulating layer 24 is deposited on the interlayer dielectric layer 21 and contact plugs 22 by CVD. Trenches are formed in regions where interconnections are to be formed in the insulating layer 24 by lithograph and RIE. Interconnection layers 23 to be connected to the contact plugs 22 are formed by burying a metal such as Cu in these trenches. In this manner, the semiconductor device is formed.

Generally, most of heat generated by power consumption of a semiconductor device (e.g., a semiconductor integrated circuit) is generated near a semiconductor substrate represented by a semiconductor element having a large resistance value, i.e., a MOS transistor. This heat is radiated outside the semiconductor device via, e.g., the bottom surface of the semiconductor substrate and interconnections formed above the semiconductor substrate. However, heat exceeding this heat radiation capability is generated as the power consumption increases. Accordingly, the heat must be efficiently removed from the vicinity of the heat generation source.

This embodiment takes account of these conditions, and forms the microchannels 14 and 15 for heat radiation in the regions close to the semiconductor elements and the like as heat generation sources formed in the semiconductor substrate 11. A cooling fluid is supplied into the microchannels 14 and 15.

This cooling fluid circulates in the microchannels by using a pump formed on the semiconductor substrate 11, or a pump formed outside the semiconductor device. The fluid can cool the semiconductor device by removing heat generated inside it.

The cooling fluid will be explained below. This fluid includes a gas and liquid. For example, the fluid is an insulating fluid. Examples are a gas selected from, e.g., $CO_2$, $O_2$, $N_2$, and He, and a liquid selected from, e.g., N, He, and Ar. It is also possible to use water, pure water, or a liquid prepared by mixing a preservative in water or pure water. Note that the insulating fluid is a fluid having electrical insulation properties.

The resistivity of general distilled water is about 0.1 MΩ·cm, and the electrical resistivity of ultrapure water is about 10 MΩ·cm. The resistivity thus changes in accordance with the amount of ions contained in water. To obtain a high heat radiation efficiency, it is desirable to supply the cooling fluid to the vicinity of a semiconductor element formed in a semiconductor substrate. However, if the fluid flows through regions having different potentials, electric currents corresponding to the resistances of the cooling fluid flow.

For example, even when ultrapure water having a high resistivity is used, if a microchannel having a depth of 0.3 μm and a width of 0.3 μm extends through regions having different potentials, the resistance value per unit length (μm) is 10 MΩ. This resistance value is 100 to 1,000 times as high as a resistance value of 10 to 100 KΩ per unit length (μm) when a MOS transistor is in operation, and has no influence on the operation of the MOS transistor.

As described above, the material of the cooling fluid is selected in accordance with the resistivity such that the material has no influence on the operation of a semiconductor element, and that a leakage current produced by the cooling fluid flowing through the microchannel does not increase the power consumption of the whole semiconductor device.

The power consumption resulting from the leakage current produced by the cooling fluid in the microchannel can also be reduced by setting the same potential in all regions with which the cooling fluid flowing through the microchannel comes in contact, in addition to the selection of the material of the cooling fluid.

Figure 9:
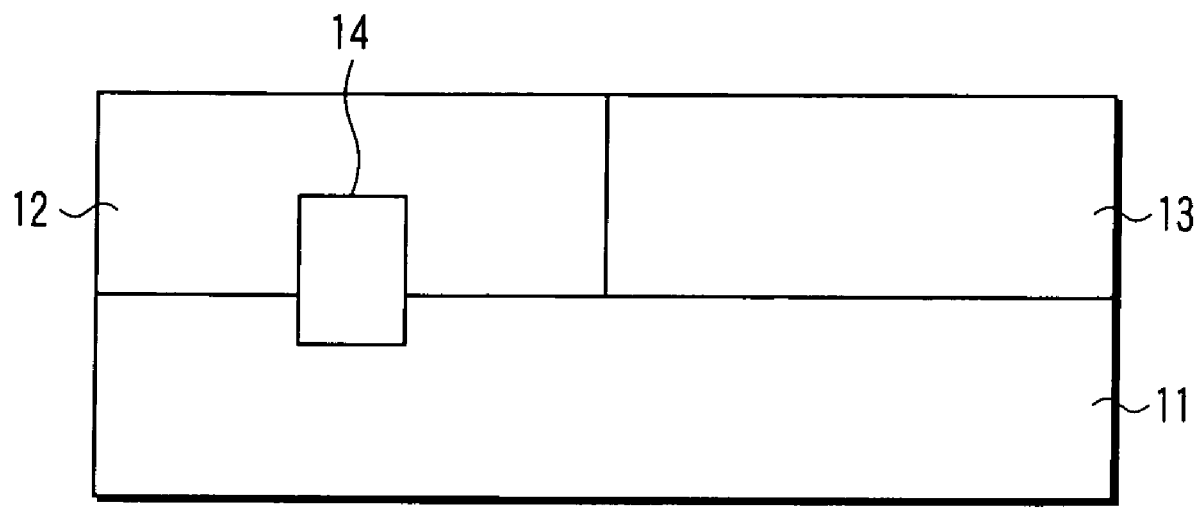
FIG. 9 is a sectional view illustrating another example of the microchannel.

FIG. 9 is a sectional view illustrating another example of a microchannel. Note that FIG. 9 is a sectional view of a semiconductor device cut in a direction perpendicular to a direction in which the microchannel extends. Note also that FIG. 9 does not show semiconductor elements, STIs, and the like.

Referring to FIG. 9, a microchannel 14 is formed in a p-type semiconductor substrate 11 to have a region in contact with a p-type well 12 having the same conductivity type as the p-type semiconductor substrate 11. More specifically, the depth of the bottom surface of the microchannel 14 is larger than that of the p-type well 12. In addition, the depth of the upper surface of the microchannel 14 is smaller than that of the p-type well 12.

The same potential (e.g., the ground potential Vss) is supplied to the p-type semiconductor substrate 11 and p-type well 12. Accordingly, a leakage current based on the cooling fluid flowing through the microchannel 14 has almost no influence on the semiconductor device. Even when the microchannel is formed in this way, it is possible to efficiently radiate the heat of both the p-type semiconductor substrate 11 and p-type well 12 via the cooling fluid.

Note that a microchannel may also be formed in contact with both semiconductor regions different in conductivity type (in this embodiment, both the p-type semiconductor substrate 11 and n-type well 13). In this case, however, the cooling fluid must be selected so as not to increase the leakage current between the semiconductor regions different in conductivity type. For example, an insulating fluid can reduce the leakage current resulting from the fluid.

Figure 10:
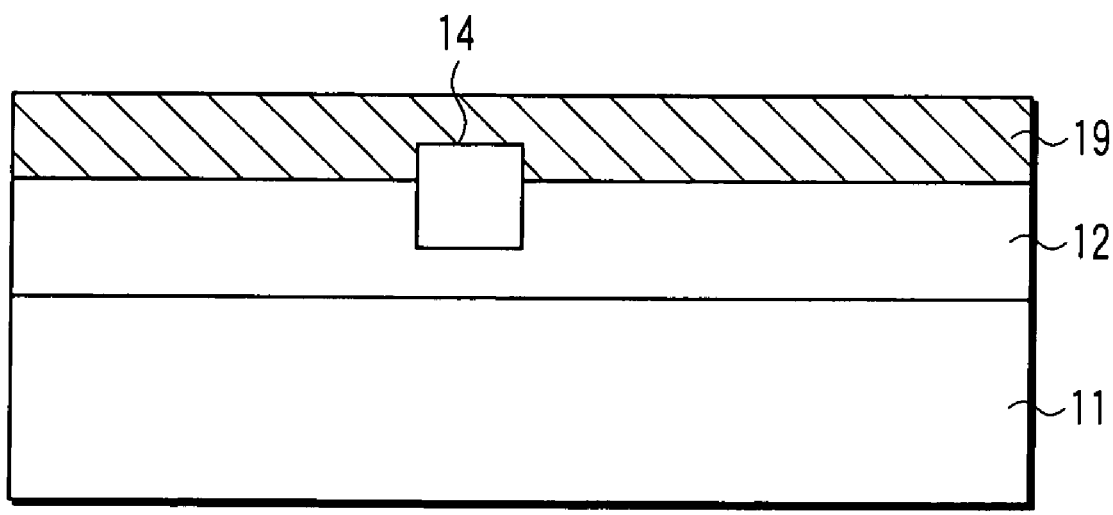
FIG. 10 is a sectional view illustrating still another example of the microchannel.

FIG. 10 is a sectional view illustrating still another example of a microchannel. Note that FIG. 10 is a sectional view of a semiconductor device cut in a direction perpendicular to a direction in which the microchannel extends. Note also that FIG. 10 does not show semiconductor elements, STIs, and the like, as in FIG. 9.

Referring to FIG. 10, a microchannel 14 is formed in contact with both a p-type well 12 and $p^+$-type heavily doped impurity region 19 having the same conductivity type in a p-type semiconductor substrate 11. The same potential is supplied to the p-type well 12 and heavily doped impurity region 19. Accordingly, almost no leakage current is produced by the cooling fluid flowing through the microchannel 14.

Also, the heavily doped impurity region 19 has a low thermal resistance. Therefore, the heat of the heavily doped impurity region 19 is efficiently radiated from the cooling fluid. In addition, the heat of the p-type well 12 is also efficiently radiated because the p-type well 12 is electrically connected to the heavily doped impurity region 19.

As has been explained in detail above, this embodiment forms the microchannels in the regions close to the semiconductor elements, interconnections, and the like formed in the semiconductor substrate, and hence can efficiently radiate the heat generated from the semiconductor elements, interconnections, and the like.

Also, the semiconductor substrate and the well having the same conductivity type as the semiconductor substrate are set at the same potential. Accordingly, even when a microchannel is formed in contact with both the semiconductor substrate and the well having the same conductivity type as the semiconductor substrate, a leakage current resulting from the cooling fluid flowing through the microchannel has almost no influence on the semiconductor device. In addition, even when a leakage current based on crystal defects or the like produced when the microchannel is formed is generated, this leakage current has no influence on the operation of the semiconductor device.

Since the microchannel is formed in contact with the heavily doped impurity region, efficient cooling can be performed by using a low thermal resistance of the heavily doped impurity region.

Furthermore, since the microchannel is formed in contact with both the two wells different in conductivity type, the heat of these two wells can be radiated by one microchannel. In this case, however, an insulating fluid is used as the fluid as described previously. This makes it possible to reduce the leakage current between the two wells.

Second Embodiment

The second embodiment forms a microchannel in an STI formed in the surface region of a semiconductor substrate, thereby efficiently radiating heat generated from, e.g., semiconductor elements and interconnection layers formed in the semiconductor substrate.

Figure 11:
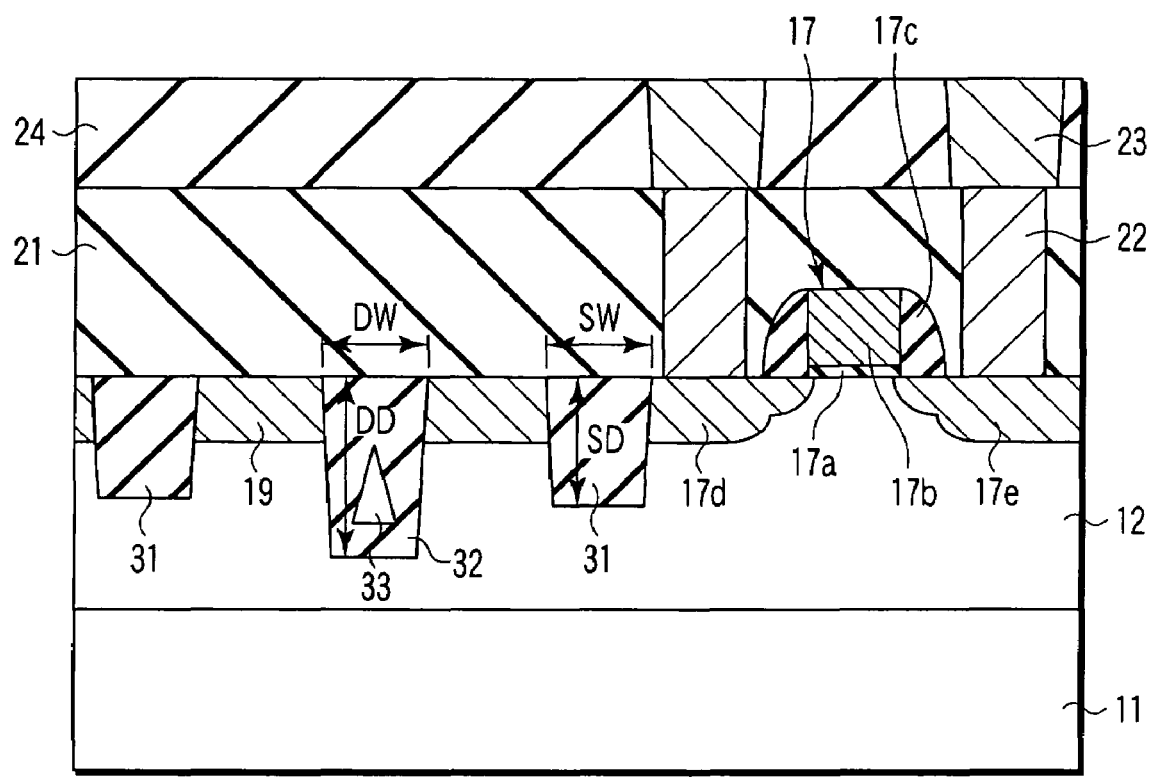
FIG. 11 is a sectional view illustrating a semiconductor device according to the second embodiment of the present invention.

FIG. 11 is a sectional view illustrating a semiconductor device according to the second embodiment of the present invention. Note that FIG. 11 is a sectional view cut in a direction perpendicular to a direction in which a microchannel extends.

In a p-type semiconductor substrate 11 (more specifically, in a p-type well 12), STIs 31 and 32 are formed to electrically isolate semiconductor elements formed in the semiconductor substrate 11. A microchannel 33 is formed in the STI 32. That is, the STI 32 electrically insulates the microchannel 33 and p-type well 12.

The microchannel 33 extends in the direction perpendicular to the drawing. Also, holes (not shown) for supplying a fluid into the microchannel 33 are formed at the two ends of the microchannel 33.

The STIs 31 and 32 have different aspect ratios. The aspect ratio is defined by the depth/width (i.e., the ratio of the depth to the width) of an STI. Letting SD and SW be the depth and width, respectively, of the STI 31, the aspect ratio of the STI 31 is SD/SW. Letting DD and DW be the depth and width, respectively, of the STI 32, the aspect ratio of the STI 32 is DD/DW. This embodiment sets the aspect ratio of the STI 32 higher than that of the STI 31.

For example, the width DW of the STI 32 is the same as the width SW of the STI 31 in this embodiment. On the other hand, the depth DD of the STI 32 is larger than the depth SD of the STI 31. The aspect ratio of the STI 32 is thus set higher than that of the STI 31.

An example of a method of manufacturing the semiconductor device will be explained below. FIGS. 12 to 15 are sectional views illustrating manufacturing steps of the semiconductor device cut in the direction perpendicular to the direction in which the microchannel extends.

Figure 12:
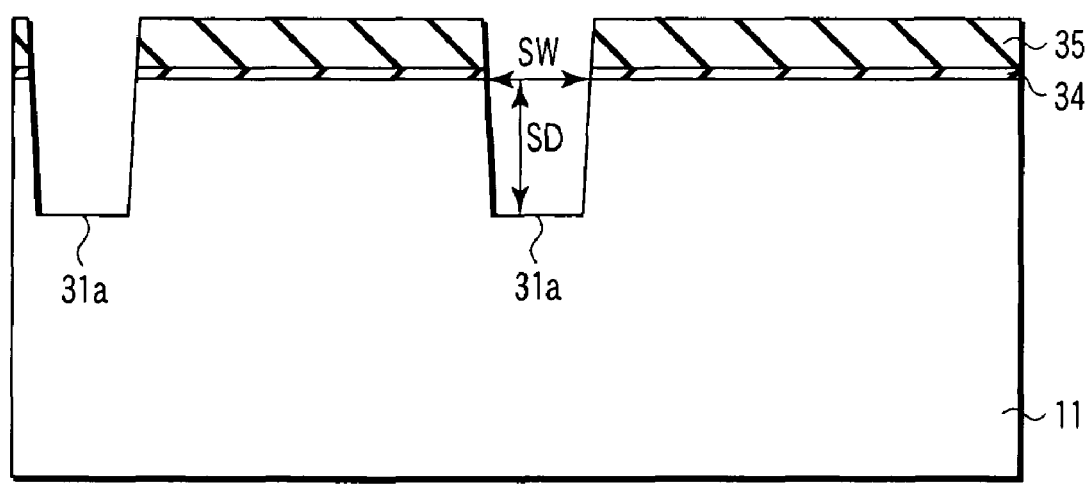
FIG. 12 is a sectional view illustrating a manufacturing step of the semiconductor device according to the second embodiment of the present invention.

First, as shown in FIG. 12, an insulating layer 34 (made of, e.g., $SiO_2$) and insulating layer 35 (made of, e.g., SiN) are sequentially deposited on a semiconductor substrate 11 by using CVD or the like. The insulating layers 34 and 35 function as protective layers for protecting the semiconductor substrate 11. Then, a resist layer (not shown) having holes which expose regions where STIs 31 are to be formed is formed on the insulating layer 35 by using lithography.

This resist layer is used as a mask to etch the semiconductor substrate 11 by RIE or the like, thereby forming trenches 31a in the semiconductor substrate 11. Each trench 31a is formed so that the aspect ratio of a trench formed in the semiconductor substrate 11 is SD/SW. After that, the resist layer is removed.

Subsequently, as shown in FIG. 13, a resist layer 36 having a hole which exposes a region where an STI 32 is to be formed is formed on the insulating layer 35 by using lithography. The width of the hole in the resist layer 36 is the same as the width SW of the STI 31. The resist layer 36 is used as a mask to etch the semiconductor substrate 11 by RIE or the like to a depth larger than the depth SD of the trenches 31a, thereby forming a trench 32a in the semiconductor substrate 11. In this manner, the trench 32a having an aspect ratio DD/DW is formed. After that, the resist layer 36 is removed.

As shown in FIG. 14, an insulating layer 37 (e.g., $SiO_2$ or SiN) is deposited on the insulating layer 35 and in the trenches 31a and 32a by using CVD or the like. The aspect ratio of the trench 32a is higher than that of the trenches 31a. Accordingly, when the insulating layer 37 is deposited so that the insulator fills the trenches 31a, a cavity 33 forms in the trench 32a.

As shown in FIG. 15, CMP (Chemical Mechanical Polishing) or the like is used to remove extra portions of the insulating layer 37 and insulating layers 34 and 35 and planarize the upper surface of the semiconductor substrate 11. Consequently, STIs 31 and 32 and a microchannel 33 are formed in the semiconductor substrate 11. Then, holes (not shown) connected to the two ends of the microchannel 33 to supply a fluid into it are formed by using lithography and RIE.

After that, as shown in FIG. 11, a p-type well 12, an n-type MOS transistor 17, interconnection layers 23, and the like are formed. These manufacturing steps are the same as in the first embodiment. In this way, the semiconductor device is formed.

In the semiconductor device thus manufactured, a cooling fluid is supplied into the microchannel 33. This cooling fluid is supplied by using a pump formed on the semiconductor substrate 11, or a pump formed outside the semiconductor device, and circulated in the microchannel. The fluid can cool the semiconductor device by removing heat generated inside it.

Figure 16:
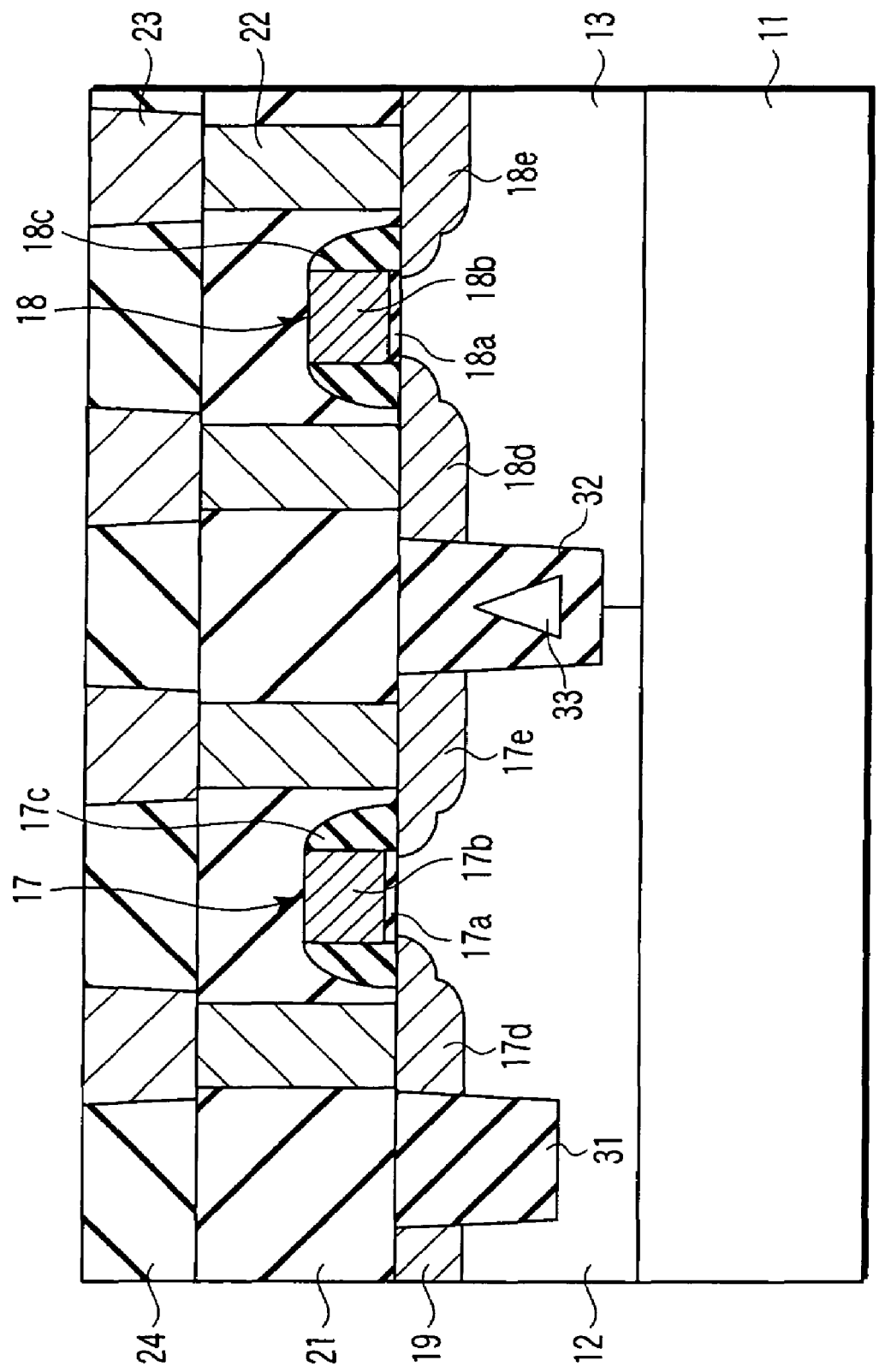
FIG. 16 is a sectional view illustrating a semiconductor device in which an STI 32 is in contact with a p-type well 12 and n-type well 13.

The STI 32 including the microchannel 33 may also be formed to extend over diffusion regions different in conductivity type (in this embodiment, the p-type well 12 and an n-type well 13) (i.e., may also be formed in contact with both the p-type well 12 and n-type well 13). FIG. 16 is a sectional view illustrating a semiconductor device in which an STI 32 comes in contact with both a p-type well 12 and n-type well 13.

The p-type well 12 and n-type well 13 are formed in a p-type semiconductor substrate 11. An n-type MOS transistor 17 is formed in the p-type well. A p-type MOS transistor 18 is formed in the n-type well. STIs 31 and the STI 32 are formed in the semiconductor substrate 11. A microchannel 33 to which the cooling fluid is to be supplied is formed in the STI 32.

The STI 32 is formed in contact with both the p-type well 12 and n-type well 13 in the boundary between them. The STI 32 electrically isolates the n-type MOS transistor 17 and p-type MOS transistor 18. Note that a method of manufacturing the semiconductor device shown in FIG. 16 is the same as the method of manufacturing the semiconductor device shown in FIG. 11.

In the semiconductor device thus manufactured, the microchannel 33 can be formed in an arbitrary portion even when diffusion regions different in conductivity type exist in the semiconductor substrate 11. Also, since the microchannel 33 is covered with the insulating layer, the p-type well 12 and n-type well 13 are not electrically connected via the fluid flowing through the microchannel 33. This reduces the influence of the microchannel 33 on the operation of the semiconductor device.

The microchannel 33 and STI 32 may also be formed in contact with both the n-type well 13 and p-type semiconductor substrate 11. That is, the microchannel 33 and STI 32 may also be formed such that the depth of the bottom surface of the STI 32 is larger than that of the n-type well 13. Even when the microchannel 33 and STI 32 are thus formed, it is possible to reduce a leakage current cause by the fluid between the n-type well 13 and p-type semiconductor substrate 11.

As has been explained in detail above, this embodiment can form the microchannel in the region close to the semiconductor elements, interconnections, and the like formed in the semiconductor substrate, and hence can efficiently radiate the heat generated from the semiconductor elements, interconnections, and the like.

Also, since the microchannel can be formed in the insulating layer, the leakage current caused by the cooling fluid supplied into the microchannel can be reduced.

Furthermore, the microchannel 33 can be formed by using the STI formation step. Accordingly, the manufacturing cost for forming the microchannel can be reduced.

Third Embodiment

The third embodiment shows another example of forming a microchannel in an STI.

Figure 17:
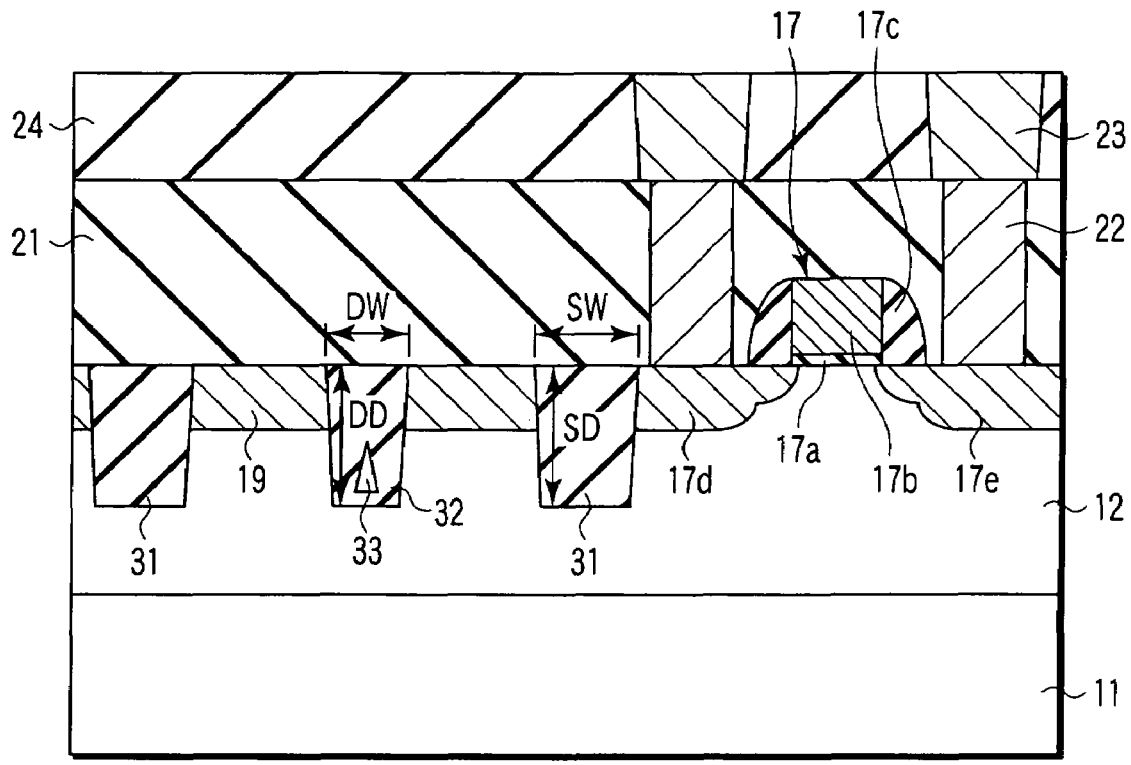
FIG. 17 is a sectional view illustrating a semiconductor device according to the third embodiment of the present invention.

FIG. 17 is a sectional view illustrating a semiconductor device according to the third embodiment of the present invention. Note that FIG. 17 is a sectional view cut in a direction perpendicular to a direction in which a microchannel extends.

In a p-type semiconductor substrate 11 (more specifically, in a p-type well 12), STIs 31 and 32 for electrically isolating semiconductor elements and the like formed in the semiconductor substrate 11 are formed. A microchannel 33 is formed in the STI 32.

The aspect ratio of the STI 32 is set higher than that of the STI 31. For example, a depth DD of the STI 32 is the same as the depth of the STI 31 in this embodiment. On the other hand, a width DW of the STI 32 is smaller than a width SW of the STI 31. The aspect ratio of the STI 32 is thus set higher than that of the STI 31.

Figure 18:
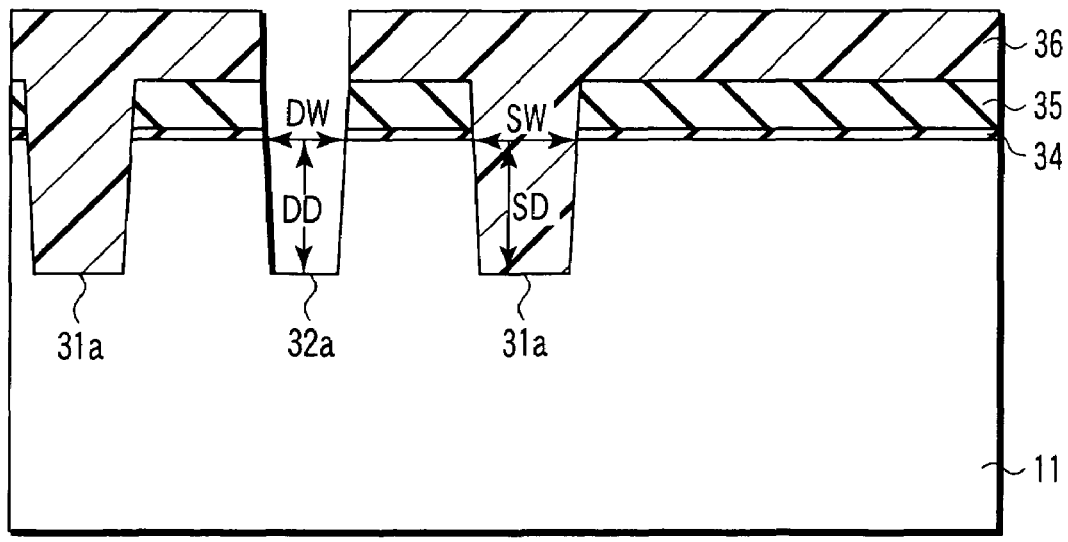
FIG. 18 is a sectional view illustrating a manufacturing step of the semiconductor device according to the third embodiment of the present invention.
Figure 19:
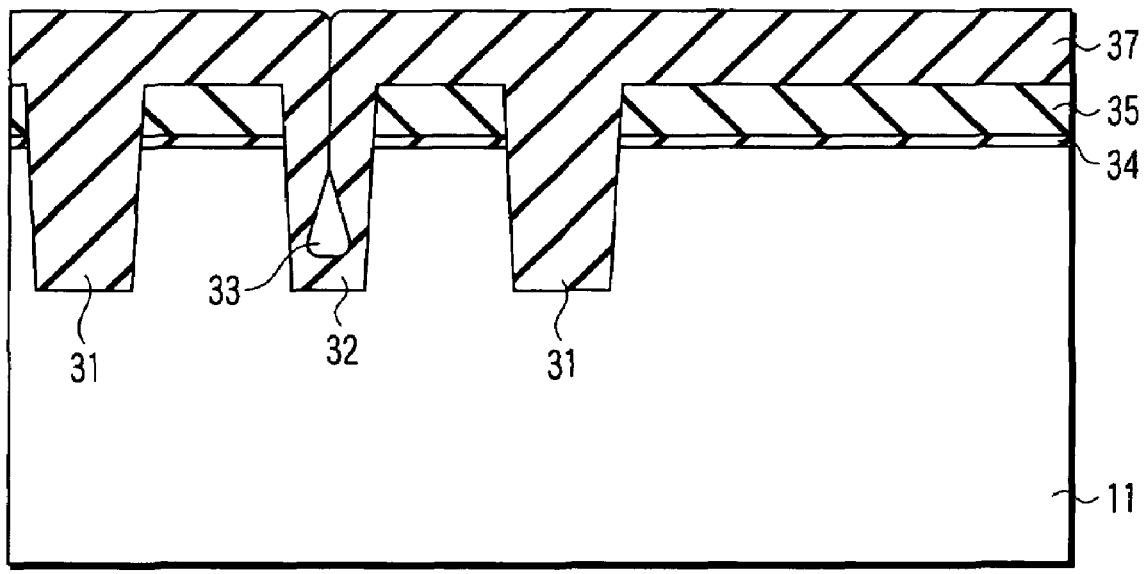
FIG. 19 is a sectional view which follows FIG. 18 and illustrates a manufacturing step of the semiconductor device cut in a direction perpendicular to a direction in which a microchannel extends.
Figure 20:
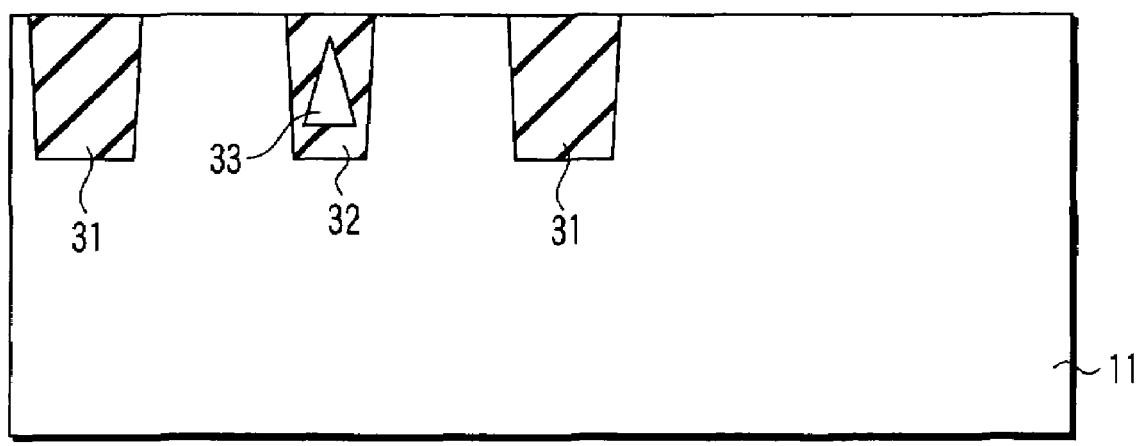
FIG. 20 is a sectional view which follows FIG. 19 and illustrates a manufacturing step of the semiconductor device cut in the direction perpendicular to the direction in which the microchannel extends.

An example of a method of manufacturing the semiconductor device will be explained below. FIGS. 18 to 20 are sectional views illustrating manufacturing steps of the semiconductor device cut in the direction perpendicular to the direction in which the microchannel extends.

As shown in FIG. 18, a resist layer 36 having a hole which exposes a region where an STI 32 is to be formed is formed on an insulating layer 35 by using lithography. The width of the hole in the resist layer 36 is set smaller than a width SW of an STI 31.

The resist layer 36 is used as a mask to etch a semiconductor substrate 11 by RIE or the like to the same depth as a depth SD of trenches 31a, thereby forming a trench 32a in the semiconductor substrate 11. In this manner, the trench 32a having an aspect ratio DD/DW is formed. After that, the resist layer 36 is removed.

Then, as shown in FIG. 19, an insulating layer 37 is deposited on the insulating layer 35 and in the trenches 31a and 32a by using CVD or the like. The aspect ratio of the trench 32a is higher than that of the trenches 31a. Accordingly, when the insulating layer 37 is deposited so that the insulator fills the trenches 31a, a cavity 33 forms in the trench 32a.

As shown in FIG. 20, CMP or the like is used to remove extra portions of the insulating layer 37 and insulating layers 34 and 35 and planarize the upper surface of the semiconductor substrate 11. Consequently, STIs 31 and 32 and a microchannel 33 are formed in the semiconductor substrate 11. Then, holes (not shown) connected to the two ends of the microchannel 33 to supply a fluid into it are formed by using lithography and RIE.

After that, as shown in FIG. 17, a p-type well 12, an n-type MOS transistor 17, interconnection layers 23, and the like are formed. These manufacturing steps are the same as in the first embodiment. In this way, the semiconductor device is formed.

The manufacturing method explained in this embodiment can also form the microchannel 33 in the STI 32. A cooling fluid flowing through the microchannel 33 can cool the semiconductor device by removing heat generated inside it. Other effects are the same as in the second embodiment.

Fourth Embodiment

The fourth embodiment shows still another example of forming a microchannel in an STI.

FIG. 21 is a sectional view illustrating a semiconductor device according to the fourth embodiment of the present invention. Note that FIG. 21 is a sectional view cut in a direction perpendicular to a direction in which a microchannel extends.

In a p-type semiconductor substrate 11 (more specifically, in a p-type well 12), STIs 31 and 32 for electrically isolating semiconductor elements and the like formed in the semiconductor substrate 11 are formed. A microchannel 33 is formed in the STI 32.

The aspect ratio of the STI 32 is the same as that of the STI 31. That is, a depth DD of the STI 32 is the same as the depth of the STI 31. Also, a width DW of the STI 32 is the same as a width SW of the STI 31.

An example of a method of manufacturing the semiconductor device will be explained below. FIGS. 22 to 25 are sectional views illustrating manufacturing steps of the semiconductor device cut in the direction perpendicular to the direction in which the microchannel extends.

As shown in FIG. 22, a resist layer 36 having holes which expose regions where STIs 31 and 32 are to be formed is formed on an insulating layer 35 by using lithography. The widths of the holes in the resist layer 36 are set to be the same.

The resist layer 36 is used as a mask to etch a semiconductor substrate 11 by RIE or the like, thereby forming trenches 31a and 32a in the semiconductor substrate 11 such that a depth SD of the trench 31a and a depth DD of the trench 32a are the same. In this manner, the trenches 31a and 32a having the same aspect ratio are formed. After that, the resist layer 36 is removed.

Figure 23:
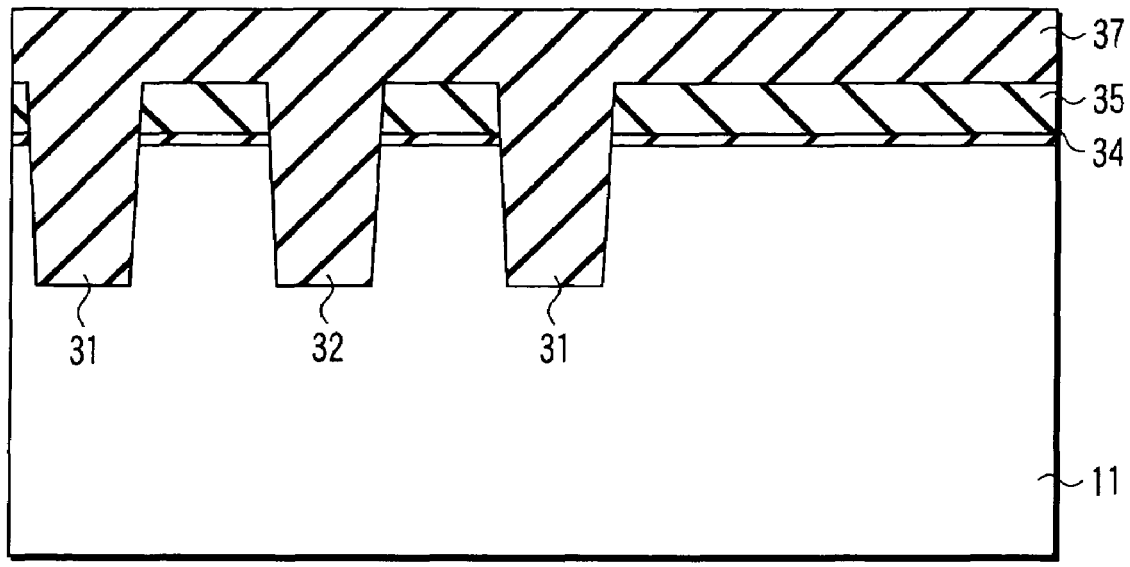
FIG. 23 is a sectional view which follows FIG. 22 and illustrates a manufacturing step of the semiconductor device cut in a direction perpendicular to a direction in which a microchannel extends.

Then, as shown in FIG. 23, an insulating layer 37 is deposited on the insulating layer 35 and in the trenches 31a and 32a by using CVD or the like. Consequently, STIs 31 and 32 are formed in the semiconductor substrate 11. In this case, no cavity is formed in the STI 32.

Figure 24:
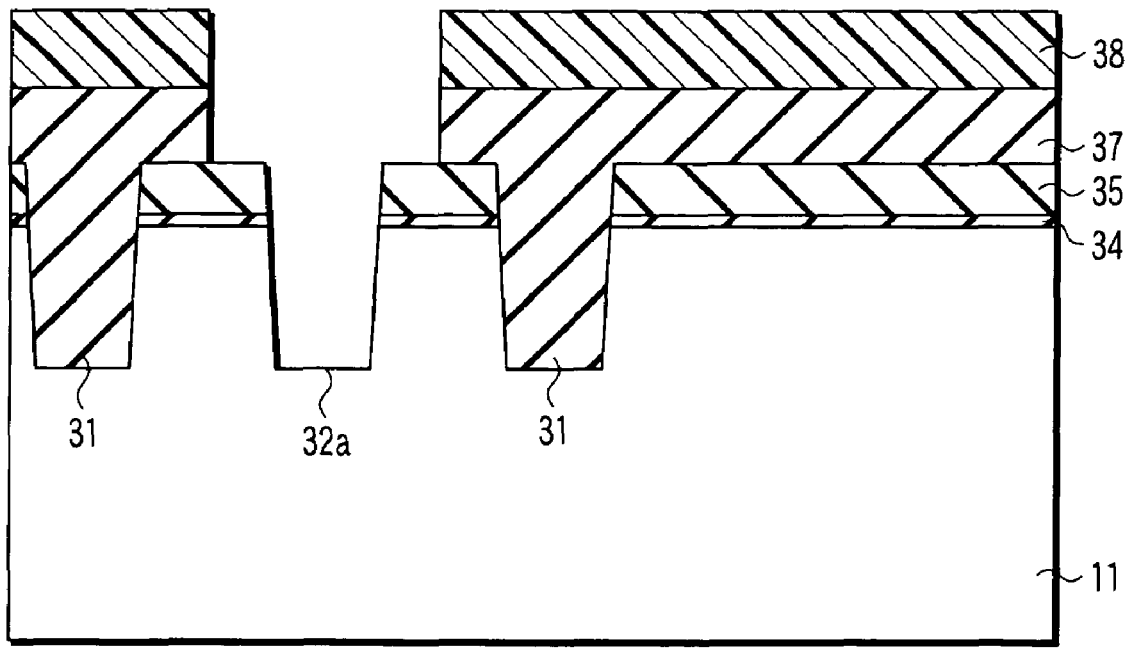
FIG. 24 is a sectional view which follows FIG. 23 and illustrates a manufacturing step of the semiconductor device cut in the direction perpendicular to the direction in which the microchannel extends.

As shown in FIG. 24, a resist layer 38 having a hole which exposes the entire insulating layer 37 above the STI 32 is formed on the insulating layer 37 by lithography. The resist layer 38 is used as a mask to etch the insulating layer 37 including the insulating layer in the trench 32a by RIE or the like, thereby exposing the trench 32a. After that, the resist layer 38 is removed.

Figure 25:
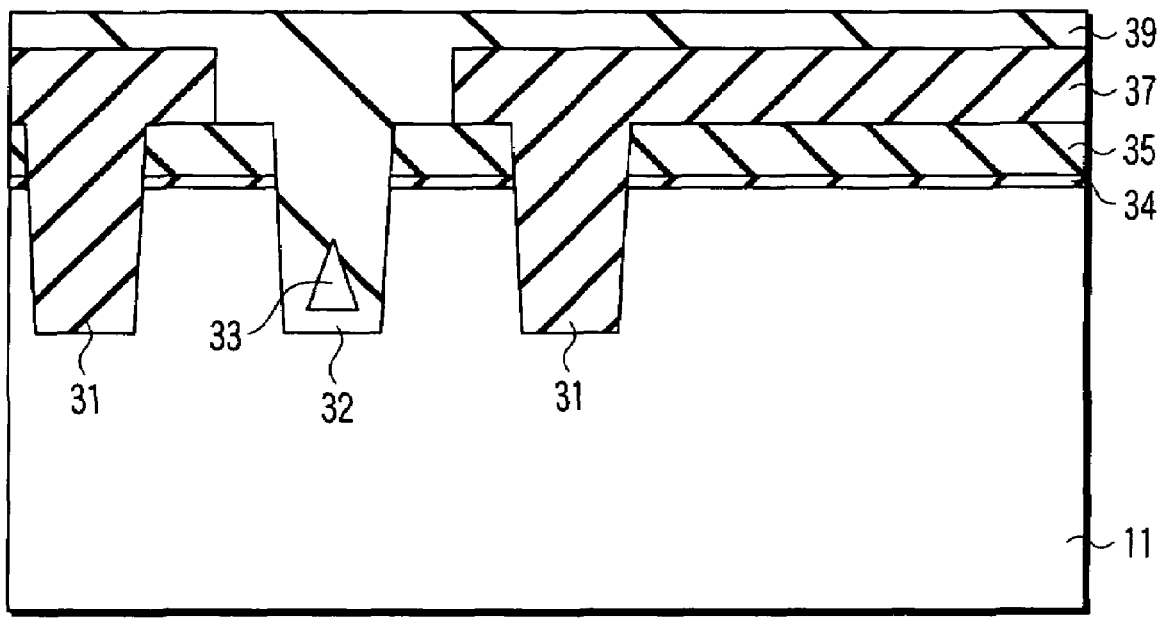
FIG. 25 is a sectional view which follows FIG. 24 and illustrates a manufacturing step of the semiconductor device cut in the direction perpendicular to the direction in which the microchannel extends.

As shown in FIG. 25, an insulating layer 39 is deposited on the insulating layer 37 and in the trench 32a by using CVD or the like, thereby forming an STI 32 in the trench 32a. In this case, the insulating layer 39 is deposited with poor burying properties. As a consequence, a cavity forms in the STI 32. This cavity is used as a microchannel 33.

Note that the poor burying properties can be adjusted by changing, e.g., the gas or heat used in the manufacturing step. The poor burying properties can also be adjusted by selecting the insulating material of the insulating layer 39.

Subsequently, CMP or the like is used to remove extra portions of the insulating layers 37 and 39 and insulating layers 34 and 35 and planarize the upper surface of the semiconductor substrate 11. Then, holes (not shown) connected to the two ends of the microchannel 33 to supply a fluid into it are formed by using lithography and RIE.

After that, as shown in FIG. 21, a p-type well 12, an n-type MOS transistor 17, interconnection layers 23, and the like are formed. These manufacturing steps are the same as in the first embodiment. In this way, the semiconductor device is formed.

In the semiconductor device thus manufactured, the microchannel 33 to which a cooling fluid is to be supplied can be formed in the STI 32 having the same aspect ratio as the STI 31. Other effects are the same as in the second embodiment.

Fifth Embodiment

The fifth embodiment shows an example of a manufacturing method of a semiconductor device, which forms a microchannel in a semiconductor substrate 11.

Figure 26:
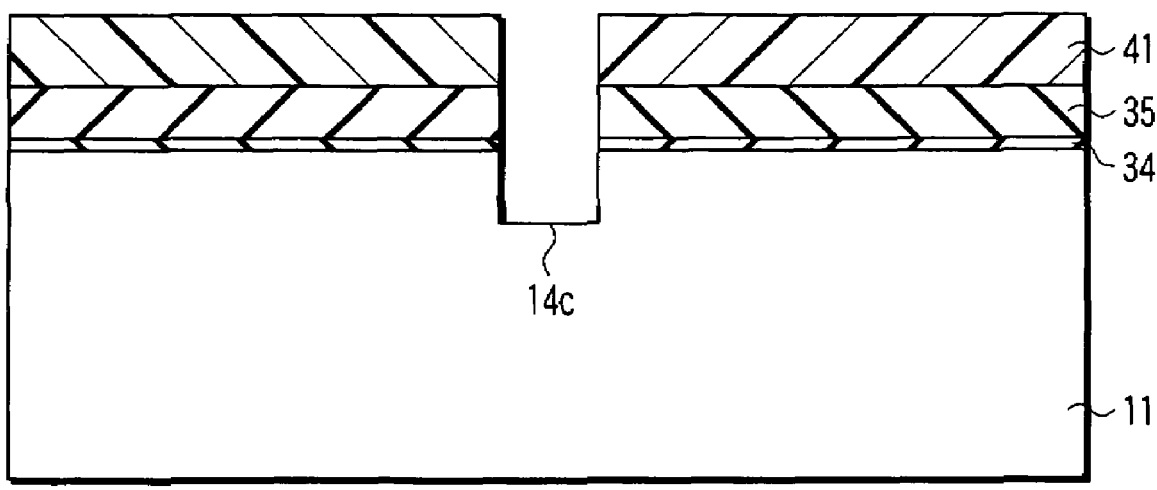
FIG. 26 is a sectional view illustrating a manufacturing step of a semiconductor device according to the fifth embodiment of the present invention.
Figure 27:
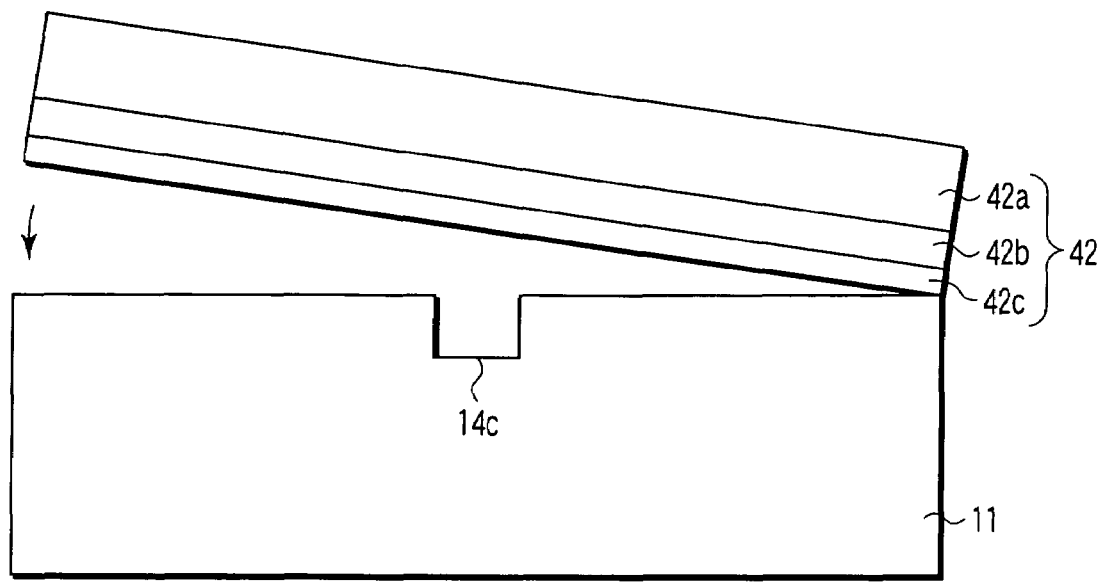
FIG. 27 is a sectional view which follows FIG. 26 and illustrates a manufacturing step of the semiconductor device cut in a direction perpendicular to a direction in which a microchannel extends.
Figure 28:
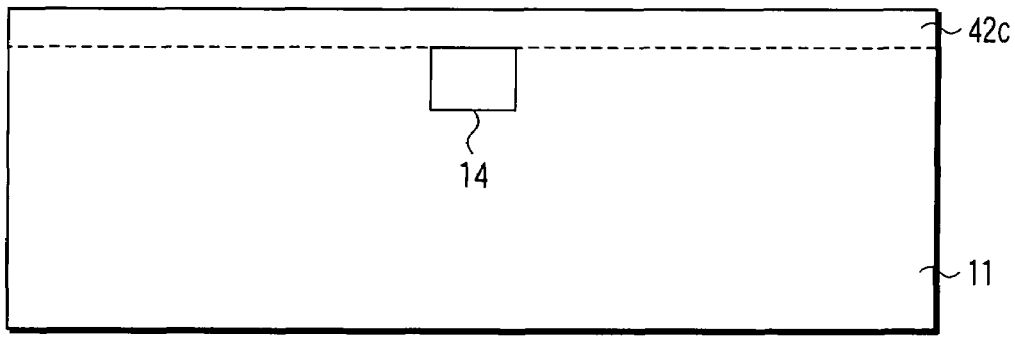
FIG. 28 is a sectional view which follows FIG. 27 and illustrates a manufacturing step of the semiconductor device cut in the direction perpendicular to the direction in which the microchannel extends.

This example of the manufacturing method according to the fifth embodiment of the present invention will be explained below with reference to the accompanying drawing. FIGS. 26 to 28 are sectional views illustrating manufacturing steps of a semiconductor device cut in a direction perpendicular to a direction in which a microchannel extends.

First, as shown in FIG. 26, an insulating layer 34 (made of, e.g., $SiO_2$) and insulating layer 35 (made of, e.g., SiN) are sequentially deposited on a semiconductor substrate 11 by using CVD or the like. A resist layer 41 having a hole in a region where a microchannel 14 is to be formed is formed on the insulating layer 35 by using lithography. The resist layer 41 is used as a mask to etch the semiconductor substrate 11 by RIE or the like, thereby forming a trench 14c in the semiconductor substrate 11. After that, the resist layer 41 and insulating layers 34 and 35 are removed.

Then, as shown in FIG. 27, an Si layer 42c is formed on the semiconductor substrate 11 by using, e.g., epitaxial layer transfer (ELTRAN). More specifically, a substrate 42 including the Si layer 42c is bonded on the semiconductor substrate 11. The substrate 42 comprises an Si substrate 42a, a porous Si layer 42b formed on the Si substrate 42a, and the Si layer 42c formed on the porous Si layer 42b. For example, the substrate 42 is formed as follows.

The porous Si layer 42b is formed by anodizing the surface of the Si substrate in an HF solution ($HF+C_2H_5OH$). The Si layer 42c is formed on the porous Si layer 42b by epitaxially growing Si on the porous Si layer 42b.

Then, the substrate 42 is bonded on the semiconductor substrate 11 so that the semiconductor substrate 11 and Si layer 42c oppose each other. Subsequently, the two substrates are annealed. As a consequence, the Si layer 42c is formed on the semiconductor substrate 11. After that, the porous Si layer 42b is removed by water jet or the like. Since the etching rate ratio of the porous Si layer 42b to the Si layer 42c is high, the porous Si layer 42b can be readily removed.

A p-type impurity is then doped into the Si layer 42c. After that, the semiconductor substrate 11 including the Si layer 42c is used as a semiconductor substrate. Holes 14a connected to the two ends of the microchannel 14 to supply a fluid into it are formed by lithography and RIE. Finally, semiconductor elements and interconnection layers are formed on the Si layer 42c.

UNIBOND may also be used as another method of forming the Si layer 42c on the semiconductor substrate 11. More specifically, hydrogen is ion-implanted into an Si substrate to form a hydrogen-implanted layer in the Si substrate. Then, the semiconductor substrate 11 and Si substrate are bonded such that the semiconductor substrate 11 and the hydrogen-implanted surface of the Si substrate oppose each other. When these substrates are annealed at 400° C. to 500° C. after that, the Si layer on the hydrogen-implanted layer is removed by the growth of microvoids produced in the hydrogen-implanted layer. The Si layer may also be formed on the semiconductor substrate 11 by this method.

As has been explained in detail above, the manufacturing method according to this embodiment can also form a microchannel inside a semiconductor substrate. Other effects are the same as in the first embodiment.

Sixth Embodiment

The sixth embodiment shows another example of the manufacturing method of the semiconductor device, which forms a microchannel in a semiconductor substrate 11.

This example of the manufacturing method according to the sixth embodiment of the present invention will be explained below with reference to the accompanying drawing. FIGS. 29, 30, 31, and 33 are sectional views illustrating manufacturing steps of a semiconductor device cut in a direction in which a microchannel extends. FIG. 32 is a plan view illustrating a manufacturing step of the semiconductor device.

Figure 29:
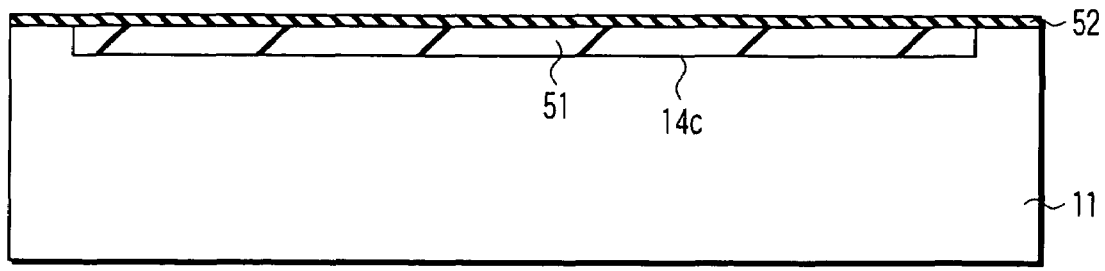
FIG. 29 is a sectional view illustrating a manufacturing step of a semiconductor device according to the sixth embodiment of the present invention.

First, as shown in FIG. 29, a trench 14c for a microchannel 14 is formed in a semiconductor substrate 11 by using lithography and RIE. An insulator (made of, e.g., $SiO_2$) is buried in the trench 14c by using CVD or the like, thereby forming an insulating layer 51 in the trench 14c. CMP or the like is used to remove an extra insulator and planarize the surface of the semiconductor substrate 11. Note that the insulating layer 51 is formed using an STI formation step. That is, a step of forming an STI 16 includes the step of forming the insulating layer 51. Accordingly, the STI 16 (not shown) is formed simultaneously with the insulating layer 51.

Subsequently, an insulating layer 52 is formed by depositing an insulator (made of, e.g., SiN) on the semiconductor substrate 11 and insulating layer 51 by using, e.g., CVD. The surface of the insulating layer 52 is planarized by using CMP or the like.

Then, as shown in FIG. 30, a resist layer 53 having holes which expose the insulating layer 52 formed on the two ends of the insulating layer 51 is formed on the insulating layer 52 by lithography. The resist layer 53 is used as a mask to etch the insulating layer 52 on the two ends of the insulating layer 51 by using, e.g., RIE. In this manner, holes 14a are formed on the two ends of the insulating layer 51.

As shown in FIG. 31, the insulating layer 51 is etched by using wet etching. This wet etching of the insulating layer 51 made of $SiO_2$ uses, e.g., HF (hydrofluoric acid) or $NH_4F$ (ammonium fluoride). After that, the resist layer 53 is removed.

Figure 33:
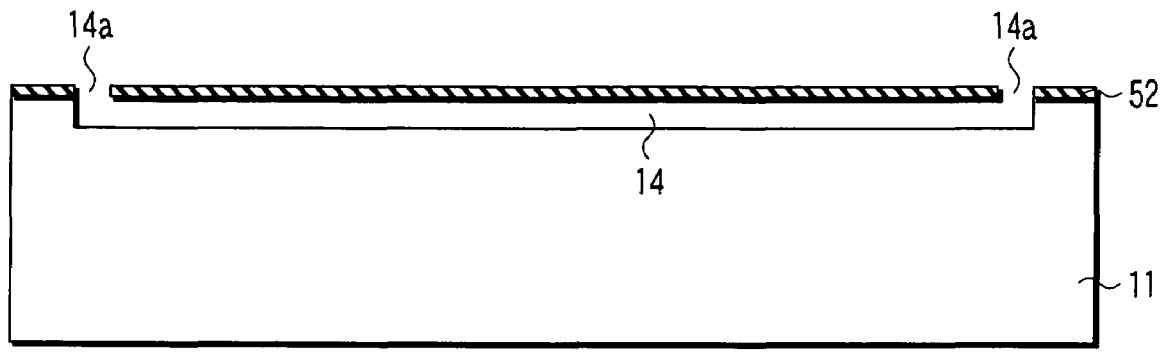
FIG. 33 is a sectional view taken along a line XXXIII-XXXIII shown in FIG. 32.

As shown in FIG. 32 and FIG. 33 (a sectional view taken along a line XXXIII-XXXIII shown in FIG. 32), the insulating layer 52 is patterned using lithography such that the planar shape of the insulating layer 52 is larger than that of the microchannel 14. That is, the insulating layer 52 functions as a lid of the microchannel 14.

After that, semiconductor elements and interconnection layers are formed on the semiconductor substrate 11. As has been explained in detail above, the manufacturing method according to this embodiment can also form a microchannel in the semiconductor substrate 11. It is also possible to form a microchannel by using the STI forming step.

Seventh Embodiment

The seventh embodiment forms a microchannel above a semiconductor substrate 11.

Figure 34:
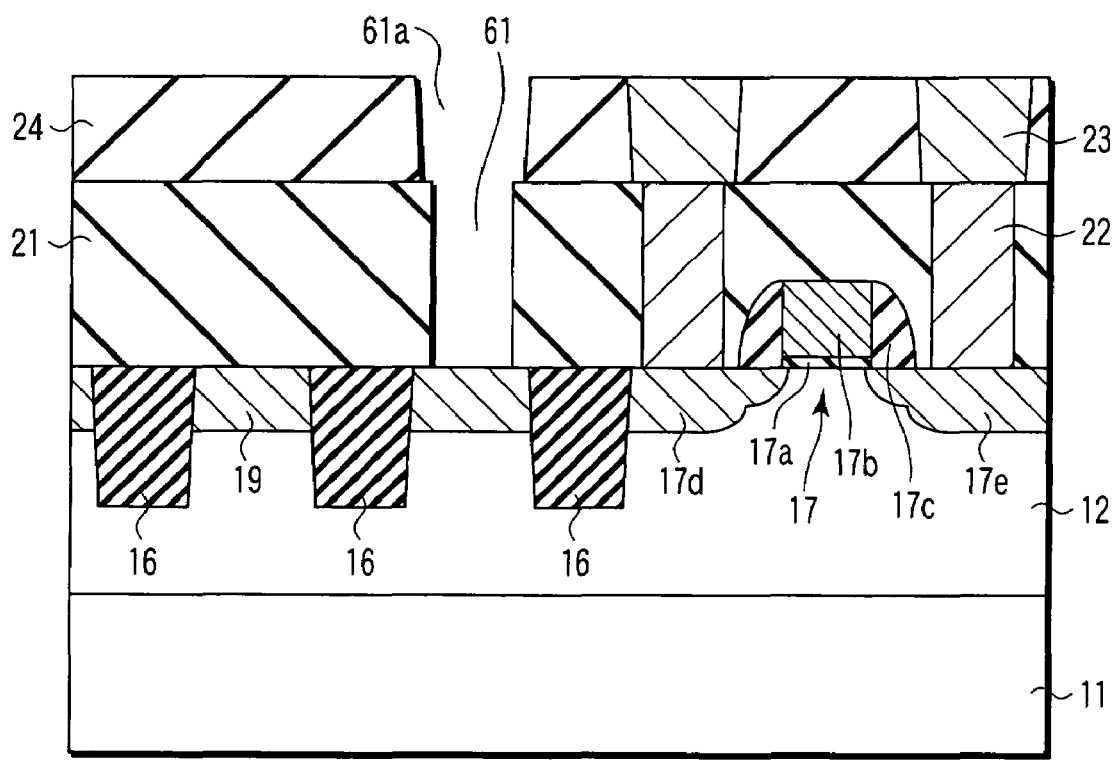
FIG. 34 is a sectional view illustrating a semiconductor device according to the seventh embodiment of the present invention.
Figure 35:
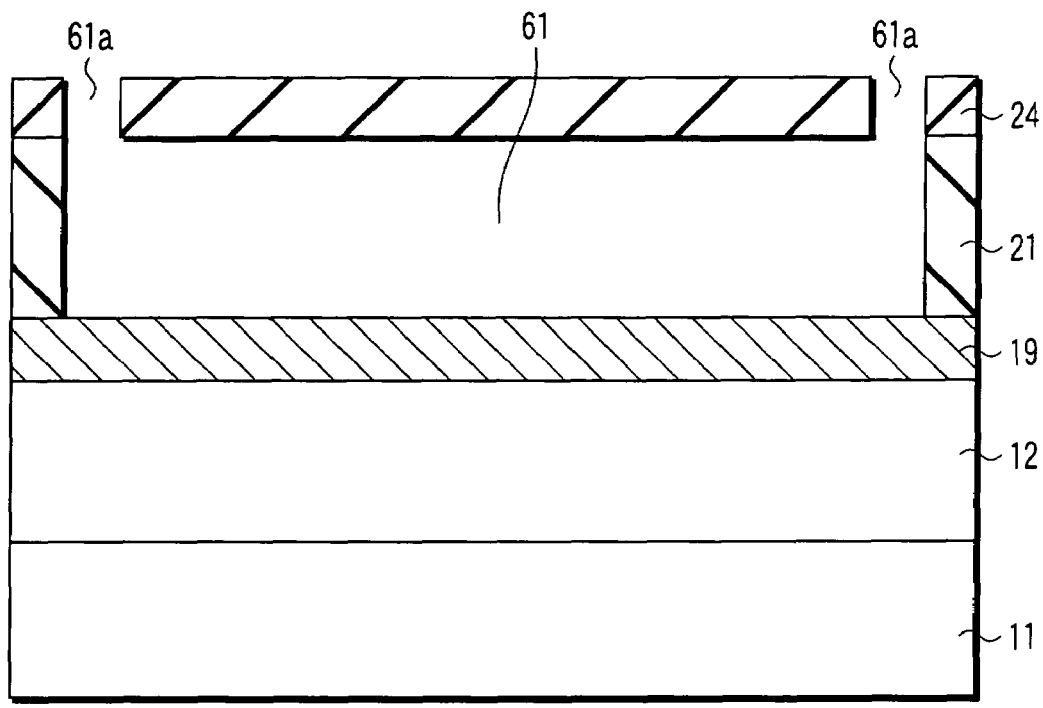
FIG. 35 is a sectional view cut in a direction in which a microchannel extends in the semiconductor device shown in FIG. 34.

FIG. 34 is a sectional view illustrating a semiconductor device according to the seventh embodiment of the present invention. Note that FIG. 34 is a sectional view cut in a direction perpendicular to a direction in which a microchannel extends. FIG. 35 is a sectional view cut in the direction in which the microchannel extends in the semiconductor device shown in FIG. 34.

An interlayer dielectric layer 21 is formed on the semiconductor substrate 11 having a semiconductor element (in this embodiment, an n-type MOS transistor 17), a $p^+$-type heavily doped impurity region 19, STIs 16, and the like. Contact plugs 22 connected to the semiconductor element and the like formed in the semiconductor substrate 11 are formed in the interlayer dielectric layer 21.

In addition, a microchannel 61 to which a cooling fluid is supplied extends in an arbitrary direction (in this embodiment, in a direction in which a gate electrode 17a of the MOS transistor 17 extends). The width and depth of the microchannel 61 are the same as, e.g., those of the contact plug 22.

An insulating layer 24 is formed on the interlayer dielectric layer 21. Interconnection layers 23 connected to the contact plugs 22 are formed in the insulating layer 24. Furthermore, holes 61a which open the two ends of the microchannel 61 are formed in the insulating layer 24. The cooling fluid is supplied from the holes 61a into the microchannel 61.

Figure 36:
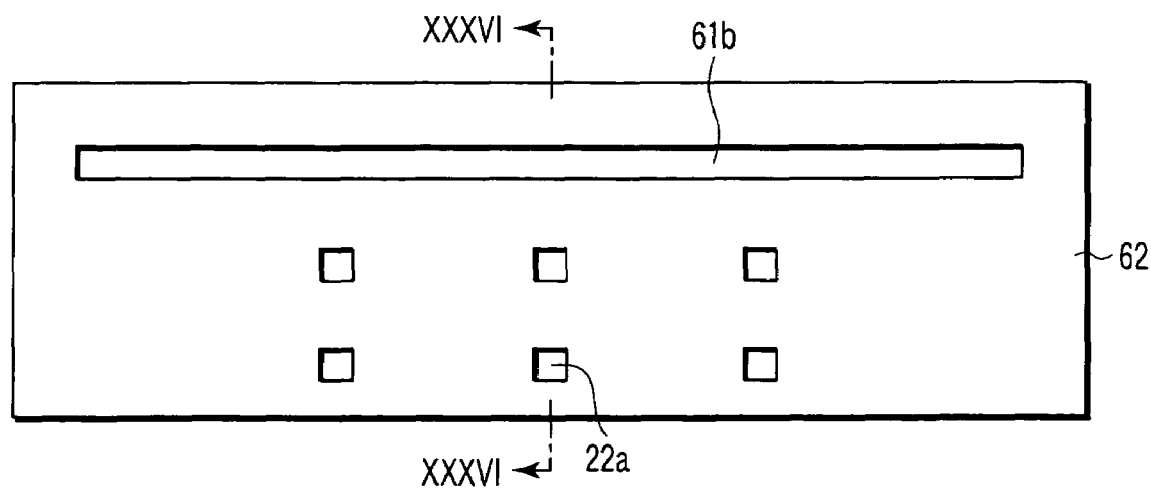
FIG. 36 is a plan view illustrating a manufacturing step of the semiconductor device according to the seventh embodiment of the present invention.

An example of a method of manufacturing the semiconductor device will be explained below with reference to the accompanying drawing. FIG. 36 is a plan view illustrating a manufacturing step of the semiconductor device. FIGS. 37, 38, 39, 41, and 43 are sectional views illustrating manufacturing steps of the semiconductor device cut in the direction perpendicular to the direction in which the microchannel extends. FIGS. 40, 42, and 44 are sectional views illustrating manufacturing steps of the semiconductor device cut in the direction in which the microchannel extends.

Manufacturing steps of the n-type MOS transistor 17, $p^+$-type heavily doped impurity region 19, and STIs 16 are the same as the manufacturing steps described in the first embodiment.

Figure 37:
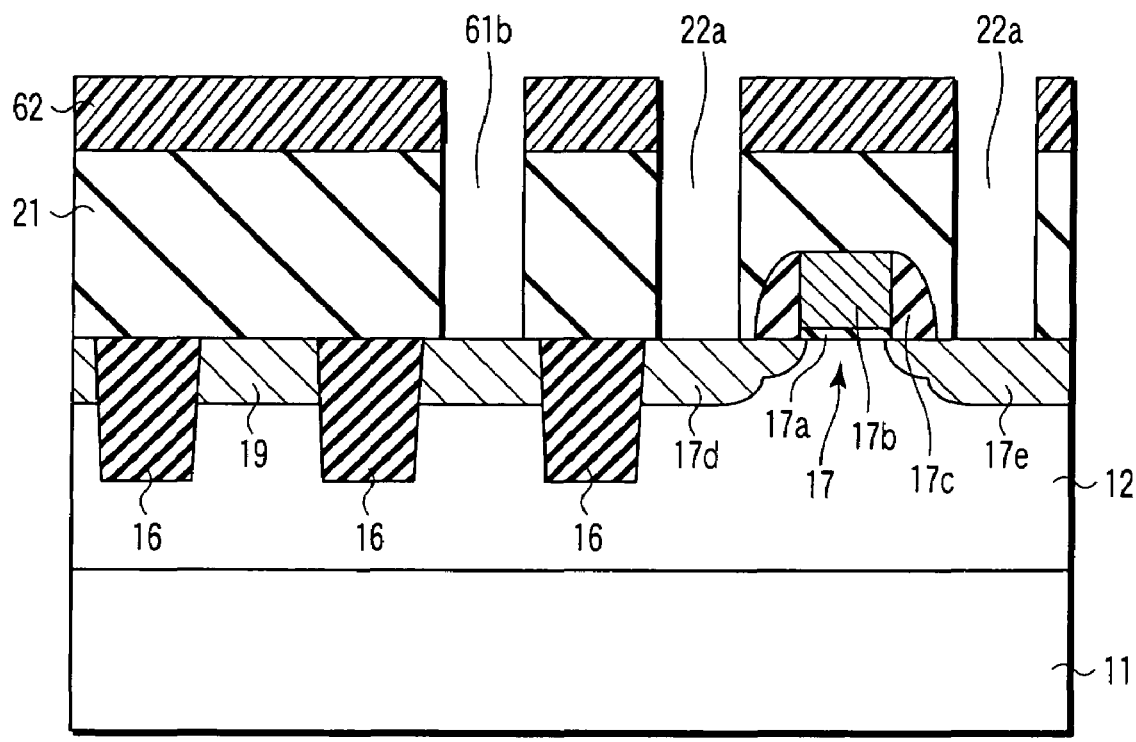
FIG. 37 is a sectional view taken along a line XXXVI-XXXVI shown in FIG. 36.

As shown in FIG. 36 and FIG. 37 (a sectional view taken along a line XXXVI-XXXVI shown in FIG. 36), an interlayer dielectric layer 21 is deposited on a semiconductor substrate 11 by using CVD or the like. A resist layer 62 having holes which expose a region where a microchannel 61 is to be formed and regions where contact plugs 22 are to be formed is formed on the interlayer dielectric layer 21 by using lithography. The resist layer 62 is used as a mask to etch the interlayer dielectric layer 21 by RIE or the like, thereby forming a trench 61b and trenches 22a in the interlayer dielectric layer 21. The trench 61b functions as a microchannel 61 later. After that, the resist layer 62 is removed.

Figure 38:
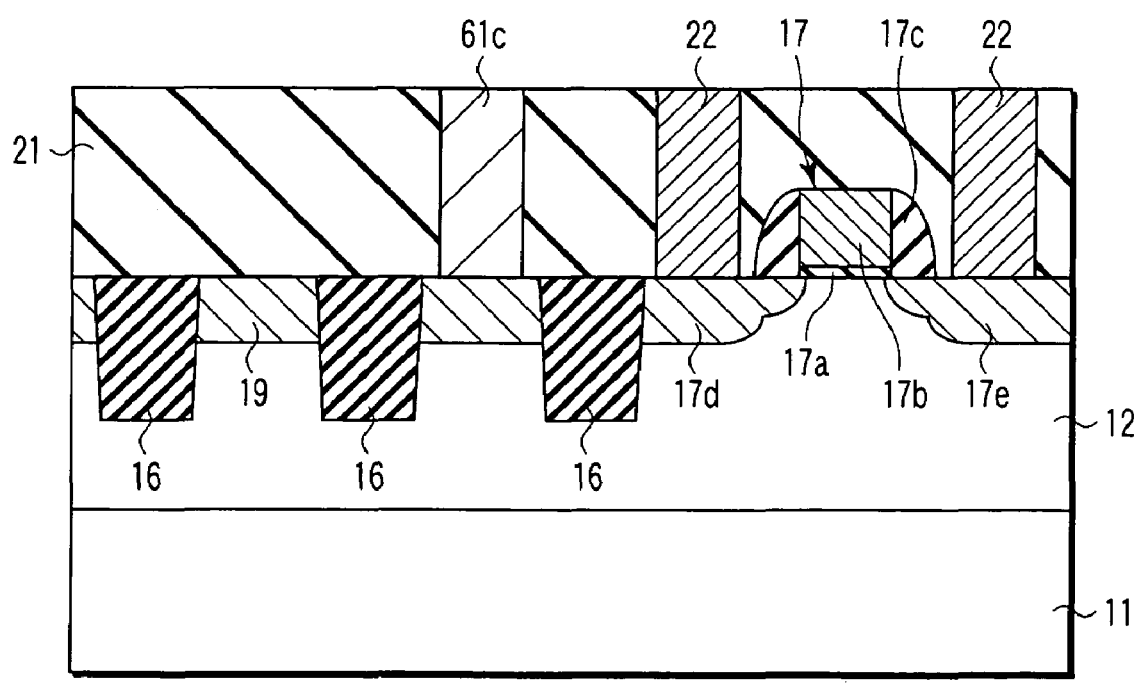
FIG. 38 is a sectional view which follows FIG. 37 and illustrates a manufacturing step of the semiconductor device cut in a direction perpendicular to the direction in which the microchannel extends.

Then, as shown in FIG. 38, a metal such as W is buried in the trench 61b and trenches 22a. CMP or the like is used to remove extra W and planarize the surface of the interlayer dielectric layer 21. In this manner, a metal layer 61c and contact plugs 22 are formed in the interlayer dielectric layer 21.

As shown in FIGS. 39 and 40, an insulating layer 24 is formed on the interlayer dielectric layer 21 by using, e.g., CVD. A resist layer 63 having holes which expose regions where holes 61a to be connected to the two ends of a microchannel 61 are to be formed and regions where interconnection layers 23 are to be formed is formed on the insulating layer 24 by using lithography. The resist layer 63 is used as a mask to etch the insulating layer 24 by RIE or the like, thereby forming holes 61a and trenches 23a in the insulating layer 24. After that, the resist layer 63 is removed.

Figure 41:
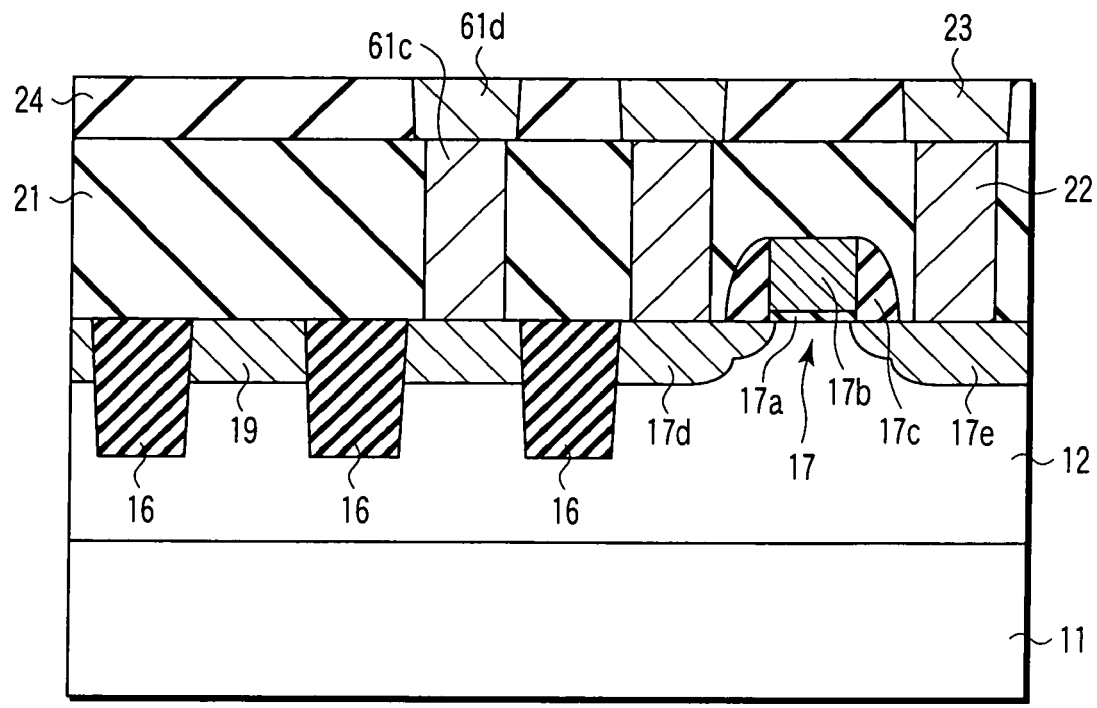
FIG. 41 is a sectional view which follows FIG. 39 and illustrates a manufacturing step of the semiconductor device cut in the direction perpendicular to the direction in which the microchannel extends.
Figure 42:
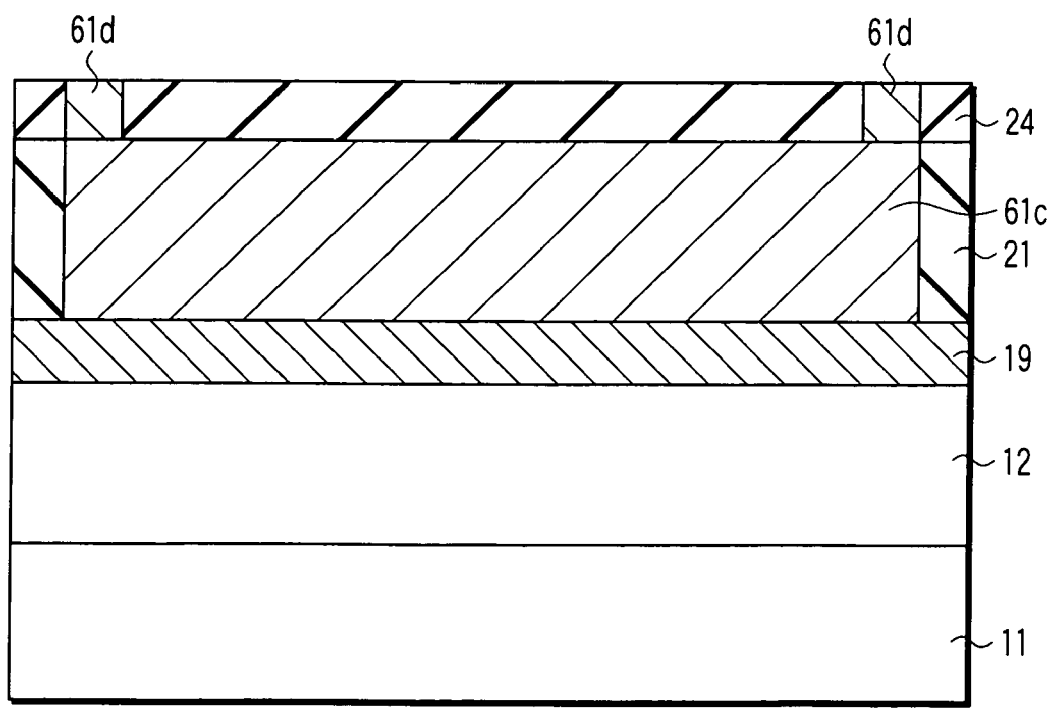
FIG. 42 is a sectional view which follows FIG. 40 and illustrates a manufacturing step of the semiconductor device cut in the direction in which the microchannel extends.

Subsequently, as shown in FIGS. 41 and 42, a metal such as Cu is buried in the holes 61a and trenches 23a. CMP or the like is then used to remove extra Cu and planarize the surface of the insulating layer 24. In this way, metal layers 61d and interconnection layers 23 are formed in the insulating layer 24.

Figure 43:
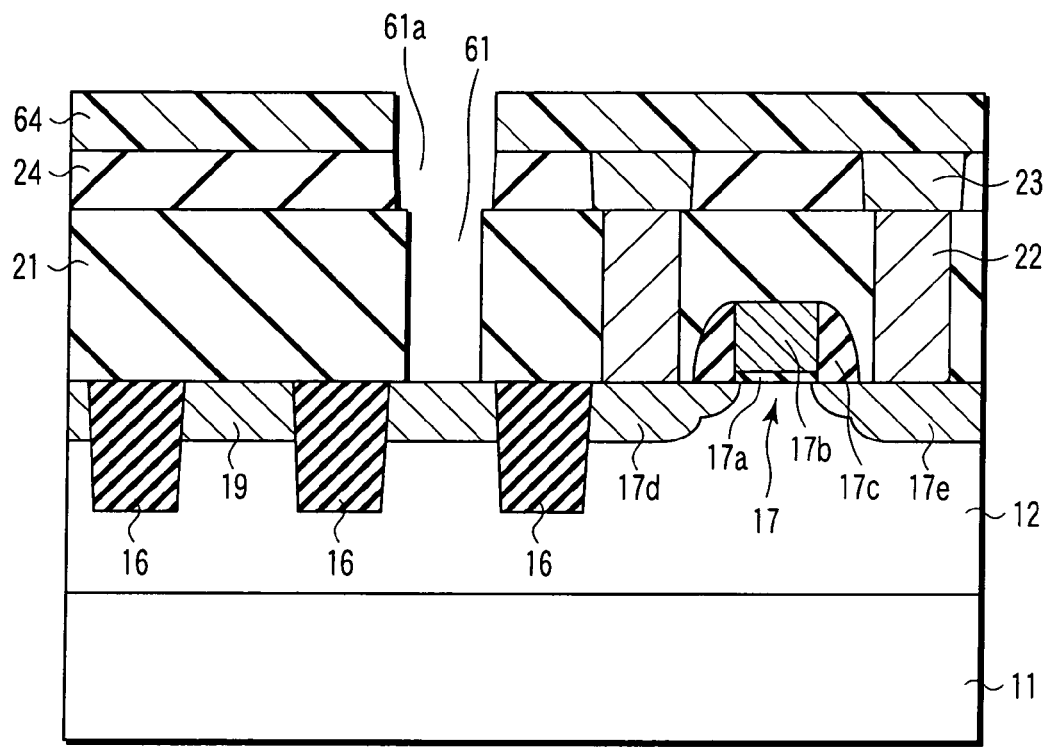
FIG. 43 is a sectional view which follows FIG. 41 and illustrates a manufacturing step of the semiconductor device cut in the direction perpendicular to the direction in which the microchannel extends.
Figure 44:
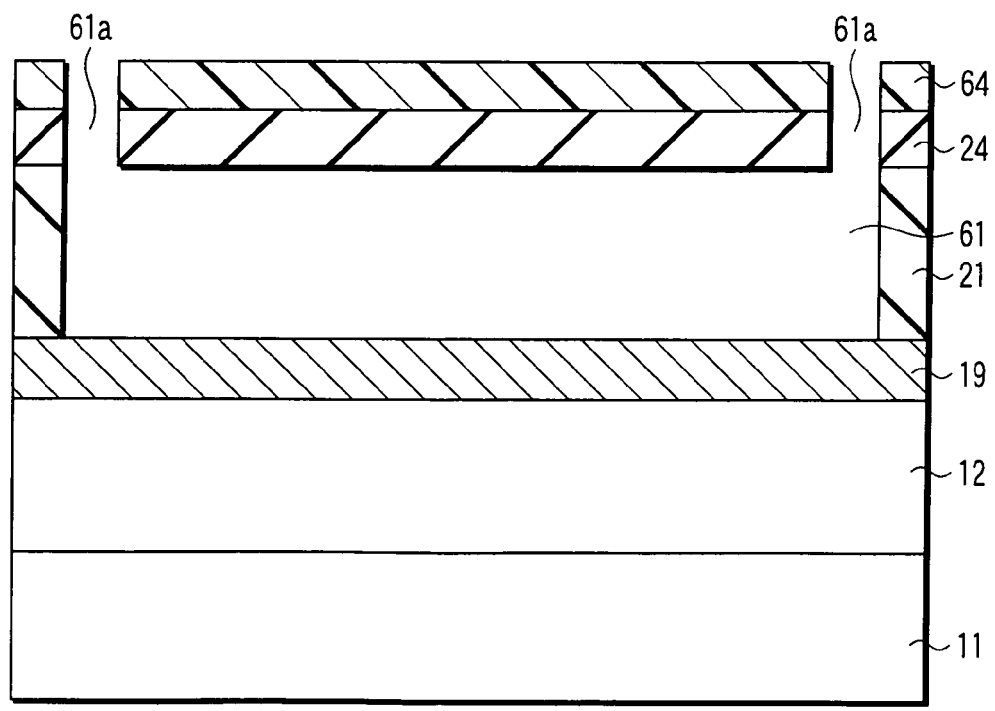
FIG. 44 is a sectional view which follows FIG. 42 and illustrates a manufacturing step of the semiconductor device cut in the direction in which the microchannel extends.

As shown in FIGS. 43 and 44, a resist layer 64 having holes which expose the metal layers 61d is formed on the insulating layer 24 by using lithography. The metal layer 61c and metal layers 61d are then wet-etched by using an acidic solution. An example of this acidic solution is a solution mixture of sulfuric acid ($H_2SO_4$) and hydrogen peroxide ($H_2O_2$). As a consequence, a microchannel 61 is formed in the interlayer dielectric layer 21, and holes 61a are formed in the insulating layer 24. After that, the resist layer 64 is removed. In this manner, the semiconductor device including the microchannel 61 is formed as shown in FIGS. 34 and 35.

In the semiconductor device thus manufactured, the cooling fluid flowing through the microchannel 61 can cool the semiconductor device by removing heat generated inside it. In addition, the semiconductor device can be efficiently cooled because the microchannel 61 can be formed in the position close to the semiconductor element and interconnection layers.

Note that the microchannel 61 need not reach the heavily doped impurity region 19. That is, a portion of the interlayer dielectric layer 21 may also be formed between the microchannel 61 and heavily doped impurity region 19. This arrangement can reduce a leakage current resulting from the fluid by surrounding the microchannel 61 by the insulating layer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
   a semiconductor substrate;
   a first diffusion region formed in the semiconductor substrate;
   a semiconductor element formed in the first diffusion region; and
   a channel formed in the first diffusion region having a cooling fluid,
   wherein the cooling fluid flows through the channel.

2. The device according to claim 1, further comprising a heavily doped impurity region formed in the first diffusion region, a conductivity type of the heavily doped impurity region being the same as a conductivity type of the first diffusion region, and an impurity concentration of the heavily doped impurity region being higher than an impurity concentration of the first diffusion region,
   wherein the channel is in contact with the heavily doped impurity region.

3. The device according to claim 1, wherein
   a conductivity type of the semiconductor substrate and a conductivity type of the first diffusion region are the same, and
   a depth of a bottom surface of the channel is larger than a depth of the first diffusion region.

4. The device according to claim 1, further comprising a second diffusion region formed in the semiconductor substrate,
   wherein a conductivity type of the semiconductor substrate and the first diffusion region is a first conductivity type,
   a conductivity type of the second diffusion region is a second conductivity type,
   the channel is in contact with the first diffusion region and the second diffusion region, and
   the fluid is an insulating fluid.

5. The device according to claim 1, wherein the semiconductor element is a transistor.

6. A semiconductor device, comprising:
   a semiconductor substrate;
   a first diffusion region formed in the semiconductor substrate;
   a first semiconductor element formed in the first diffusion region;
   a channel formed in the first diffusion region having a cooling fluid, wherein the cooling fluid flows through the channel; and
   an insulating layer which electrically insulates the first diffusion region and the channel, and surrounds the channel.

7. The device according to claim 6, wherein the insulating layer functions as an element isolation region.

8. The device according to claim 6, further comprising:
   a second diffusion region formed in the semiconductor substrate; and
   a second semiconductor element formed in the second diffusion region,
   wherein a conductivity type of the semiconductor substrate and the first diffusion region is a first conductivity type,
   a conductivity type of the second diffusion region is a second conductivity type, and
   the insulating layer is in contact with the first diffusion region and the second diffusion region.

9. A semiconductor device comprising:
   a semiconductor substrate;
   a diffusion region formed in the semiconductor substrate;
   a semiconductor element formed in the diffusion region;
   an interlayer dielectric layer formed on the semiconductor substrate; and
   a channel formed in the interlayer dielectric layer having a cooling fluid, wherein the cooling fluid flows through the channel.

10. The device according to claim 9, further comprising:
    an insulating layer formed on the interlayer dielectric layer; and
    a first hole and a second hole formed in the insulating layer and connected to two ends of the channel.

11. The device according to claim 10, further comprising:
    an interconnection layer formed in the insulating layer; and
    a contact plug formed in the interlayer dielectric layer to connect the semiconductor element and the interconnection layer.

12. The device according to claim 1, wherein the channel is a hole, and the first diffusion region surrounds the channel.

13. The device according to claim 1, wherein the channel is linear, and has an entrance and an exit of the cooling fluid.

* * * * *